US006368485B1

(12) United States Patent
Ue et al.

(10) Patent No.: US 6,368,485 B1
(45) Date of Patent: Apr. 9, 2002

(54) FORMING ELECTROLYTE FOR FORMING METAL OXIDE COATING FILM

(75) Inventors: Makoto Ue; Fumikazu Mizutani; Sachie Takeuchi; Hiroshi Takaha, all of Ibaraki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/570,557

(22) Filed: May 12, 2000

Related U.S. Application Data

(63) Continuation-in-part of application No. 09/341,664, filed as application No. PCT/JP98/04957 on Nov. 2, 1998.

(30) Foreign Application Priority Data

| Nov. 18, 1997 | (JP) | 9-316952 |
| Nov. 21, 1997 | (JP) | 9-321019 |
| Nov. 25, 1997 | (JP) | 9-322847 |
| Nov. 27, 1997 | (JP) | 9-3259814 |
| Apr. 30, 1998 | (JP) | 10-120427 |
| May 1, 1998 | (JP) | 10-121907 |

(51) Int. Cl.$^7$ ............................. C25D 3/00; C25D 7/06; C25D 7/12; C25D 9/06
(52) U.S. Cl. ..................... 205/234; 205/224; 205/139; 205/325
(58) Field of Search ................... 205/124, 234, 205/325, 324, 332, 333, 224, 139; 438/30

(56) References Cited

U.S. PATENT DOCUMENTS 5,456,815 A * 10/1995 Fukuyo et al. ......... 204/293.13
5,733,661 A * 3/1998 Ue et al. ................. 428/426
5,830,786 A * 11/1998 Zang et al. ............. 438/163
5,837,121 A * 11/1998 Kinard et al. ........... 205/322
5,843,225 A * 12/1998 Takayama et al. .......... 117/8
5,849,604 A * 12/1998 Sugawara et al. ......... 438/30
6,225,218 B1 * 5/2001 Yamazaki et al. ........ 438/660

FOREIGN PATENT DOCUMENTS

| JP | 4-356926 | 12/1992 |
| JP | 5-271992 | 10/1993 |
| JP | 5-271994 | 10/1993 |
| JP | 6-322588 | 11/1994 |
| JP | 8-134692 | 5/1996 |
| JP | 8-250494 | 9/1996 |
| JP | 10-123087 | 5/1998 |
| JP | 10-173254 | 6/1998 |

* cited by examiner

Primary Examiner—Edna Wong
Assistant Examiner—Thao Tran
(74) Attorney, Agent, or Firm—Oblon, Spivak, McClelland, Maier & Neustadt, P.C.

(57) ABSTRACT

Disclosed is a forming electrolyte for forming metal oxide coating films which comprises one or more kinds of solutes selected from the group consisting a salt of inorganic acid and salt of organic carboxylic acid dissolved in a solvent having analcoholic hydroxyl group or aprotic organic solvent, provided that, when the solvent having an alcoholic hydroxyl group is selected, the salt of organic carboxylic acid is selected from salts of aromatic carboxylic acids, salts of aliphatic polycarboxylic acid having 3–5 carbon atoms with no hydroxyl groups, salts of monohydroxy carboxylic acid having 2–5 carbon atoms, and salts of amino acid. By anodically oxidizing metal using the forming electrolyte, there can be formed an oxide coating film of high insulation property with a high throughput, in which hillocks are effectively suppressed.

21 Claims, 9 Drawing Sheets

FORMING ELECTROLYTE FOR FORMING METAL OXIDE COATING FILM

This application is a Continuation-in-part(CIP) of application Ser. No. 09/341,664 filed Sep. 20, 1999, pending, which was originally filed as International Application No. PCT/JP98/04957 on Nov. 2, 1998.

TECHNICAL FIELD

The present invention relates to a technique for forming an oxide coating film by anodic oxidation of metal, especially aluminum or an aluminum alloy. More specifically, the present invention relates to a forming electrolyte for forming an oxide coating film on metal, a method for forming an oxide coating film that utilizes the forming electrolyte, a metal whose surface has an oxide coating film that is formed by using the forming electrolyte, and a method for manufacturing a metal wiring whose surface has an oxide coating film that is formed by using the forming electrolyte. The present invention can effectively be utilized, in particular, in the forming treatment of gate wiring of thin film transistor (TFT) devices of liquid crystal display panels, or wiring of integrated circuits.

BACKGROUND ART

Metals and alloys are utilized in various industrial applications using their characteristic properties. In particular, aluminum, aluminum alloys and the like are effectively used for wiring of TFT devices, integrated circuits and the like because of their low specific resistance. As for the wiring of these devices, it is necessary to form an insulation film on its surface in order not to cause short-circuit between the wiring and other wiring or electrodes.

As a method of forming an insulation film on the surfaces of aluminum, aluminum alloys and the like, there has been known a forming treatment by anodic oxidation. In this method, an oxide film is formed on a surface of aluminum, aluminum alloys or the like by electrochemically oxidizing the surface in a forming electrolyte. Because this method has a function of recovering defects resulting from uniformity of substrate, it is excellent in that it can easily form a dense and smooth oxide coating film. For this reason, the oxide film forming method by the forming treatment has been effectively utilized in the wiring production process of TFT devices or integrated circuits.

As the forming electrolyte used for the oxide coating film formation for aluminum, aluminum alloys etc., various compositions have been proposed so far. For example, JP-A-58-147069 (the code "JP-A" herein used means a Japanese patent unexamined publication [Kokai]) discloses use of aqueous solution of ammonium tartrate, and JP-A-63-164 discloses use of aqueous solutions of citric acid and sodium tartrate as the forming electrolyte. Further, JP-A-61-133662 discloses use of a forming electrolyte composed of 1:3 mixture of 1% aqueous solution of ammonium borate or 3% aqueous solution of tartaric acid and propylene glycol. JP-A-2-85826 discloses use of a forming electrolyte composed of 3% aqueous solution of tartaric acid, which is diluted with ethylene glycol or propylene glycol, and adjusted to around pH 7 with aqueous ammonia. In JP-A-6-216389, used is a forming electrolyte composed of 3:7 (volume ratio) mixture of aqueous solution of 1% ammonium tartrate, aqueous solution of 1% ammonium adipate, aqueous solution of 1% ammonium oxalate or 1% aqueous solution of ammonium citrate, and ethylene glycol. In JP-A-8-50304, used is a forming electrolyte composed of 9:1:10 mixture of 3% aqueous solution of tartaric acid, 15% acetic acid, and 3% ethylene glycol. In JP-A-8-286209, an aqueous solution of inorganic acid ammonium salt selected from ammonium tetraborate, ammonium pentaborate, and ammonium borate, and aqueous solution of organic acid ammonium salt selected from ammonium tartrate, ammonium citrate, ammonium adipate, ammonium phthalate, ammonium oxalate, ammonium salicylate and ammonium carbonate are used as the forming electrolyte.

While various forming electrolytes have been proposed so far as mentioned above, those forming electrolytes could not afford an oxide coating film of sufficient insulation property when metal, in particular, aluminum or an aluminum alloy, is anodically oxidized by using these forming electrolytes. Therefore, in order to prevent dielectric breakdown, it has been necessary to further form another insulation film on the formed oxide film. Especially in case of manufacturing of TFT devices, a thick SiN film is formed on the oxide film by CVD to compensate insulation. Since CVD is performed at an elevated temperature, there has been arisen a problem that needlelike minute projections called hillocks are produced on the aluminum-containing surface of the metal, grow and penetrate the gate insulation film to generate defects in display panels during that operation.

Moreover, the anodic oxidation using the conventional forming electrolytes also suffers a drawback of slow formation speed. In order to obtain a higher formation speed, the formation current density must be made higher exceeding a required level. Therefore, raising the throughput using the conventional forming electrolytes has suffered a certain bound.

On the other hand, it has been proposed to use alloys composed of aluminum added with silicon or copper as wiring materials in order to suppress hillock generation in integrated circuits. Gate wiring composed of these alloys whose surfaces have anodic oxide coatings can be also used for TFT-LCDs, and using aluminum added with rare earth elements (JP-A-7-45555, JP-A-8-250494, and JP-A-8-306693), or added with valve metals (JP-A-8-286209) has been tried recently.

In order to effectively suppress the hillock generation by using aluminum added with rare earth elements, however, a relatively large amount of rare earth elements needs to be added (T.Onishi, E. Iwamura, and K. Takagi, J.Vac..Sci.Technol. A, 15 (4), 2339 (1997)). When a large amount of rare earth elements is added, however, a specific resistance of the wiring becomes quite high compared with that of pure aluminum, and there is a negative effect that the rare earth element is moved into an oxide coating film during anodic oxidation, causing a harmful influence. As for these methods, it has also been proposed that a part or whole of rare elements in a state of solid solution is deposited as an intermetallic compound by heat treatment at 300° C. or higher to lower a specific resistance, but a wiring having a specific resistance of 4 $\mu\Omega \cdot cm$ or lower favorably used in a large or high-definition TFT-LCD has not been obtained. Therefore, the hillock generation could not be effectively suppressed while good physical property was maintained.

Therefore, the present invention aimed at solving the problems of these conventional arts.

That is, an object of the present invention is to provide a novel forming electrolyte which can form an oxide coating film having sufficient insulation property for metals including aluminum and aluminum alloys. Another object of the present invention is to provide a forming electrolyte that can afford a high formation rate and raise the throughput of processes including anodic formation. A still further object of the present invention is to provide a forming electrolyte that can suppress the hillock generation on metal surface by using that forming electrolyte for anodic oxidation of metals such as aluminum and aluminum alloys.

The present invention also aimed at providing a method for forming an oxide film of good insulation property at a high throughput, a metal having a highly insulating oxide coating film in which the hillock generation is suppressed, and a method for manufacturing an aluminum containing metal wiring capable of suppressing the hillock generation effectively while maintaining a low specific resistance.

DESCRIPTION OF THE INVENTION

In order to achieve the foregoing objects, the present inventors earnestly conducted studies. As a result, we found that a combination of particular solute and solvent can provide a forming electrolyte for forming metal oxide coating film which can achieve the objects, and thus completed the present invention. That is, the present invention provides a forming electrolyte for forming a metal oxide coating film which comprises one or more kinds of solutes selected from the group consisting a salt of inorganic acid and salt of organic carboxylic acid dissolved in a solvent having an alcoholic hydroxyl group or aprotic organic solvent, provided that, when the solvent having an alcoholic hydroxyl group is selected, the salt of organic carboxylic acid is selected from a salt of aromatic carboxylic acid, a salt of aliphatic polycarboxylic acid having 3–5 carbon atoms and no hydroxyl groups, a salt of monohydroxy carboxylic acid having 2–5 carbon atoms, and a salt of amino acid.

As the inorganic acid used for the forming electrolyte of the present invention, an inorganic oxoacid is preferable. In particular, one or more compounds selected from the group consisting of boric acid, phosphoric acid, sulfuric acid, tungstic acid, molybdic acid, chromic acid, and vanadic acid are preferable. As the organic carboxylic acid used for the forming electrolyte of the present invention, one or more compounds selected from the group consisting of salicylic acid, phthalic acid, benzoic acid, γ-resorcylic acid, maleic acid, fumaric acid, itaconic acid, malonic acid, succinic acid, glutaric acid, dimethylmalonic acid, citraconic acid, lactic acid, malic acid, aspartic acid, and glutamic acid are preferable. Further, as the solvent having an alcoholic hydroxyl group used for the forming electrolyte of the present invention, ethylene glycol or propylene glycol is preferable, and the γ-butyrolactone or propylene carbonate is preferable as the aprotic organic solvent.

The present invention also provides a method for forming a metal oxide coating film which method comprises a step of performing anodic oxidation of metal in the aforementioned forming electrolyte. The metal to be subjected to the anodic oxidation includes, for example, metal wiring thin films patterned on substrates and the like, and those obtained by sputtering of aluminum or aluminum alloys containing a rare earth element such as Sc, Nd, and Gd can be exemplified.

The present invention further provides metal, especially an aluminum alloy, having an oxide film that is formed by the aforementioned film forming method on its surface.

The present invention still further provides a method for manufacturing a metal wiring including a step of forming an oxide coating film by anodic oxidation in a nonaqueous solution containing a salt of inorganic oxoacid or a salt of organic carboxylic acid on an aluminum wiring containing in a range of 0.01% by weight to 8% by weight of a rare earth element, an aluminum wiring containing a rare earth element and having a specific resistance of 10 $\mu\Omega$·cm or lower, an aluminum wiring containing a rare earth element and having a peak intensity ratio of Al (220) peak to Al (111) peak by X-ray diffraction, Al(220)/Al (111), of 0.01 to 10000, or an aluminum wiring containing a rare earth element and having an integration intensity ratio of Al (220) peak to Al (111) peak by X-ray diffraction, Al (220) Al (111), of 0.01 to 10000.

BRIEF DESCRIPTION OF THE DRAWINGS

The above and other objects and features of the invention are apparent to those skilled in the art from the following referred embodiments thereof when considered in conjunction with the accompanied drawings, in which.

Figure 1:
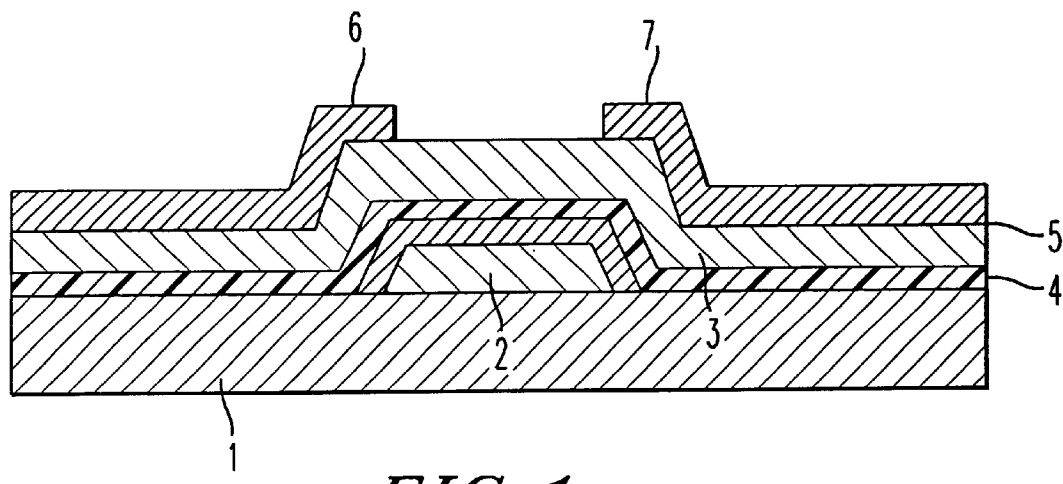
FIG. 1 is a sectional view of a bottom gate type TFT device.
Figure 2:
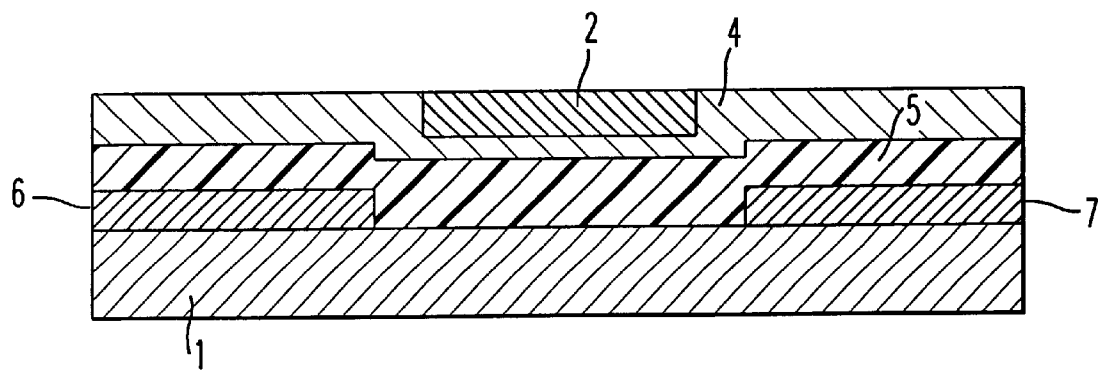
FIG. 2 is a sectional view of a top gate type TFT device.

The devices shown in FIG. 1 and FIG. 2 comprise a substrate 1, gate electrode 2, oxide coating film 3, gate insulation film 4, semiconductor layer 5, source electrode 6, and drain electrode 7.

MODE FOR CARRYING OUT THE INVENTION

The forming electrolyte for forming a metal oxide coating film, the method for forming a metal oxide coating film, the metal having a formed metal oxide coating film, and the method for manufacturing a metal wiring having a formed oxide coating film of the present invention will be explained in detail hereinafter.

One or more compounds selected from the group consisting of salts of inorganic acids and salts of organic carboxylic acids are used for the forming electrolyte for forming a metal oxide coating film of the present invention as a solute.

As the salt of the inorganic acid used as the solute, it is preferable to use a salt of inorganic oxoacid. The inorganic oxoacid is an inorganic acid having a hydrogen atom which is bound to the oxygen atom, and can be dissociated as a proton, and its central atom may be either nonmetallic or metallic element. Specifically, there can be exemplified inorganic oxoacids having a nonmetallic central atom, such as boric acid, phosphoric acid, sulfuric acid, nitric acid, silicic acid, and carbonic acid, and inorganic oxoacids having a metallic central atom, such as tungstic acid, molybdic acid, chromic acid, vanadic acid, perrhenic acid, and permanganic acid. Among these, it is particularly preferable to use boric acid, phosphoric acid, sulfuric acid, tungstic acid, molybdic acid, chromic acid, and vanadic acid. Moreover, the inorganic oxoacid used for the present invention may be a polyacid, and the polyacid may be an isopolyacid, or a heteropolyacid.

The salt of organic carboxylic acid used as the solute can be selected from various salts of organic compounds having a carboxyl group. The number and the bonding position of the carboxyl group are not particularly limited. Preferable are salts of aromatic carboxylic acids, aliphatic polycarboxylic acids, monohydroxy carboxylic acids, and amino acids.

As the aromatic carboxylic acids, those compounds having a benzene ring, condensed benzene ring, non-benzene aromatic ring, heterocyclic aromatic ring or the like, and a carboxyl group can be used. As the aromatic carboxylic acid which does not contain a hetero atom, there can be exemplified salicylic acid, phthalic acid, benzoic acid, γ-resorcylic acid, toluic acid, cumilic acid, t-butylbenzoic acid, anisinic acid, 2,4-cresotinic acid, cinnamic acid, N-methylanthranilic acid, gentisic acid, gallic acid, and p-hydroxybenzoic acid. As the hetero aromatic carboxylic acid, nicotinic acid, 2-froinic acid, 2-tenoinic acid, and hydrazylbenzoic acid can be exemplified. Furthermore, so long as the desired advantages of the present invention are not degraded, aromatic carboxylic acids which have functional groups other than carboxyl group can also be used. For example, aromatic carboxylic acids that have a nitro group or an amino group such as nitrobenzoic acid, anthranilic acid, monomethylaminobenzoic acid, and dimethylaminobenzoic acid can also be used. These may be used individually, or in any combination of two or more of them. In the invention, it is preferable to use, among the aromatic carboxylic acids, a salicylic acid, phthalic acid, benzoic acid or γ-resorcylic acid individually or in combination.

As the aliphatic polycarboxylic acid, there can be exemplified tartaric acid, citric acid, tartronic acid, malic acid, oxalic acid, malonic acid, succinic acid, glutaric acid, adipic acid, pimelic acid, suberic acid, azelaic acid, sebacic acid, dimethylmalonic acid, diethylmalonic acid, dipropylmalonic acid, 2-methylglutaric acid, 3,3-dimethylglutaric acid, 3-methyladipic acid, maleic acid, fumaric acid, itaconic acid, citraconic acid, 2-methyleneglutaric acid, 2-methyl-2-pentadicarboxylic acid and the like. Furthermore, aliphatic polycarboxylic acids which have functional groups other than carboxyl groups can be used as long as the desired advantages of the present invention are not degraded. These aliphatic polycarboxylic acids may be used individually or in any combination of two or more of them. In this invention, it is preferable to use aliphatic dicarboxylic acids having two carboxyl groups in a molecule. This compound may be used solely or in combination with other compounds.

The monohydroxy carboxylic acid is not particularly limited as long as it is a compound having an alcoholic hydroxyl group as well as at least one carboxyl group in a molecule and having 2–5 carbon atoms. The type may be any type of L type, D type or DL type, and it may be natural or synthetic.

The examples of these monohydroxy carboxylic acids include, for example, glycolic acid, lactic acid, α-oxy-n-butyric acid, α-oxyisobutyric acid, α-oxy-n-valeric acid, α-oxyisovaleric acid, 2-oxy-2-methylbutyric acid, and α-oxyacrylic acid as an α-oxyacids, hydroacrylic acid, β-oxybutyric acid, β-oxyisobutyric acid, β-oxy-n-valeric acid, β-oxyisovaleric acid, α-ethylhydroacrylic acid, and oxypivalic acid as β-oxyacids, and tartronic acid, methyltartronic acid, ethyltartronic acid, hydroxymethylmalonic acid, malic acid, citramaric acid, α-oxy-α'-methylsuccinc acid as oxydicarboxylic acids, or the like.

In addition, the monohydroxy carboxylic acid of 2–5 carbon atoms, having a functional group other than the alcoholic hydroxyl group or carboxyl group can be used as long as the desired advantages of the present invention are not degraded.

These monohydroxy carboxylic acids may be used individually, or in any combination of two or more of them.

In the present invention, the lactic acid and malic acid are preferable among these monohydroxy carboxylic acids, and they may be used individually or in combination.

The amino acid is not particularly limited as long as it is a compound having an amino group and a carboxyl group in a molecule, and the type may be any of L type, D type or DL type, and it may be natural or synthetic.

The examples of the amino acids include, for example, neutral acids (monoaminomonocarboxylic acids) such as glycine, alanine, valine, leucine, isoleucine and the like, acidic amino acids (monoaminodicarboxylic acids) such as aminomalonic acid, aspartic acid, glutamic acid, α-aminoadipic acid, α-aminopimelic acid and the like, basic amino acids (diaminomonocarboxylic acids) such as lysine, arginine and the like, aromatic amino acids such as phenylalanine, tyrosine and the like, sulfur-containing amino acids such as cysteine, cystine, methionine and the like, oxyamino acids such as serine, threonine and the like, amino acids having heterocycles such as histidine, tryptophan, proline, hydroxyproline and the like, asparagine, glutamine, oxyproline, glycylglycine, glutathione, γ-aminobutyric acid, aminocaproic acid, diaminovaleric acid, citrulline acids and the like. These may be used individually or in any combination of one or two of them.

In the present invention, preferably used among the mentioned amino acids are acidic amino acids, and particularly preferable are the aspartic acid and the glutamic acid which are used individually, or in combination thereof.

When a solvent having an alcoholic hydroxyl group is used as the solvent of the forming electrolyte, the salt of organic carboxylic acid as the solute should be selected from the group consisting of salts of aromatic carboxylic acids, salts of aliphatic polycarboxylic acid having 3–5 carbon atomos and no hydroxyl groups, salts of monohydroxy carboxylic acid having 2–5 carbon atoms, and salts of amino acid. Examples of the salts of aromatic carboxylic acids include those exemplary compounds mentioned above. The salts of the aliphatic polycarboxylic acid having 3–5 carbon atoms and no hydroxyl groups are not particularly limited as for their structure so long as they are an aliphatic compound having two or more carboxyl groups. Therefore, they may or may not contain an unsaturated bond in their molecules. In this invention, it is preferable to use aliphatic dicarboxylic acids having two carboxyl groups in a molecule. Further, so long as the desired advantages of the present invention are not degraded, aliphatic polycarboxylic acids which have functional groups other than carboxyl group can also be used. As the aliphatic polycarboxylic acid which can be used for the present invention, for example, maleic acid, fumaric acid, itaconic acid, malonic acid, succinic acid, glutaric acid, dimethyl malonic acid, and citraconic acid can be exemplified. Especially, it is particularly preferable to use maleic acid and malonic acid. The aforementioned exemplified compounds can be raised as the monohydroxy carboxylic acid having 2–5 carbon atoms and the amino acid.

Cations for forming salts of these inorganic acids or organic carboxylic acids are not particularly limited. For example, ammonium ions, alkali metal ions, primary, secondary, tertiary or quaternary alkylammonium ions, phosphonium ions, sulfonium ions and the like can be used. Among these, it is particularly preferable to use ammonium ions, primary, secondary, tertiary or quaternary alkylammonium ions. In the case of using an alkylammonium ion, the size of the alkyl group can be selected considering the solubility in the solvent. Usually, an alkyl group of 1–4 carbon atoms is selected.

These solutes may be used individually, or in any combination of one or more of them. Moreover, they may be used with a solute other than the salts of inorganic acids or organic carboxylic acids. As for the solute concentration of the forming electrolyte of the present invention, it is generally selected so as to be within a range of 0.01–30% by weight, preferably 1–15% by weight.

As the solvent of the forming electrolyte of the present invention, a solvent having an alcoholic hydroxyl group or an aprotic organic solvent is used.

The nature of the compound having an alcoholic hydroxyl group used as the solvent is not particularly limited. Preferable solvents are fatty alcohols having an alcoholic hydroxyl group. For example, monohydric alcohols such as methanol, ethanol, propanol, and isopropanol; dihydric alcohols such as ethylene glycol and propylene glycol; and polyhydric alcohols, i.e., trihydric or more can be used. Further, so long as the desired advantages of the present invention are not degraded, solvents having a functional group other than alcoholic hydroxyl group in their molecule can also be used. For example, solvents having an alkoxy group in addition to the alcoholic hydroxyl group, for example, methylcellosolve or cellosolve can also be used.

These solvents may be used independently or in any combination of two or more of them. For the forming electrolyte of the present invention, it is preferable to use a solvent having 1–8 carbon atoms as the solvent having an alcoholic hydroxyl group. Particularly preferable solvents are ethylene glycol, propylene glycol, and a mixed solvent thereof.

The aprotic organic solvent used for the forming electrolyte of the present invention as the solvent may be either a polar solvent, or nonpolar solvent. Examples of the polar solvent include, for example, lactone solvents such as γ-butyrolactone, γ-valerolactone, and δ-valerolactone; carbonate solvents such as ethylene carbonate, propylene carbonate and butylene carbonate; amide solvents such as N-methylformamide, N-ethylformamide, N,N-dimethylformamide, N,N-diethylformamide, N-methylacetamide, N,N-dimethylacetamide and N-methylpyrrolidinone; nitrile solvents such as 3-methoxypropionitrile and glutaronitrile; phosphate solvents such as a trimethyl phosphate and triethyl phosphate. Examples of the nonpolar solvent include, for example, hexane, toluene, silicone oil and the like. These solvents may be used individually, or in any combination of two or more of them. Particularly preferable solvents for the forming electrolyte of the present invention are propylene carbonate, γ-butyrolactone and a mixed solvent thereof.

The organic solvent having an alcoholic hydroxyl group or the aprotic organic solvent used for the present invention may be added with less than 50% by weight, preferably less than 30% of water based on the whole solvent, and used. When the solvent contains water, the content of water is preferably 0.1% to less than 25%, more preferably 0.1% to less than 20%.

The forming electrolyte of the present invention can effectively be utilized for the anodic oxidation of metal. While typical conventional aqueous forming electrolytes could not form oxide coating films of good properties on metal, an excellent oxide coating film can be formed by using the forming electrolyte of the present invention.

That is, if the anodic oxidation of metal is performed by using the forming electrolyte of the present invention, an oxide coating film having higher insulation property can be formed compared with the case where the anodic oxidation is preformed by using a conventional forming electrolyte. Moreover, if the anodic oxidation is carried out by using the forming electrolyte of the present invention, high throughput production can be realized because it requires a shorter period of time for constant current formation compared with conventional forming electrolytes. Furthermore, if an oxide coating film is formed by using the forming electrolyte of the present invention, generation and growth of hillocks due to elevated temperature treatments in subsequent processes can also be prevented. Therefore, by utilizing the forming electrolyte of the present invention, an oxide coating film of high withstanding voltage can be formed efficiently. Further, the oxide coating film formed by using the forming electrolyte of the present invention may also function as an impurity intercepting coating film, protective film for wiring or substrate, anti-corrosion coating film, coloring coating film, and hygroscopic coating film.

Although it is not intended to be bound by any specific theory, it is considered that the excellent advantages of the present invention can be obtained by incorporation of a small amount of the solute or the solvent in the forming electrolyte into the oxide coating film during the formation by the action of the organic solvent having an alcoholic hydroxyl group or the aprotic organic solvent. In particular, it is considered that the incorporation of carbon atoms constituting the solute or the solvent into the oxide film should enhance the insulation property, withstanding voltage, and hillock inhibition property.

The conditions for carrying out the anodic oxidation of metal using the forming electrolyte of the present invention are not particularly limited. However, the temperature for the anodic oxidation is limited to be within a temperature range where the forming electrolyte may stably exist as a liquid, and generally in the range of −20 to 150° C., preferably 10 to 100° C. The methods for controlling electric current and voltage for the anodic oxidation are not particularly limited, and a suitable combination of such conditions that an oxide film should be formed on a surface of metal can be optionally used. Usually, formation is carried out at a constant current to a predetermined formation voltage (Vf), and when the formation voltage is achieved, the anodic oxidation is carried out by maintaining the voltage for a certain period of time. The current density for the anodic oxidation may be within a range of 0.001–100 mA/cm$^2$, preferably in a range of 0.01–10 mA/cm$^2$. The Vf is usually selected to be within a range of 20–200 V, preferably in a range of 50–150 V. Further, an alternative current with a constant peak current value may also be used instead of the direct current power source until the formation voltage is obtained, and then the current may be changed to a direct current voltage to continue the formation by maintaining that voltage.

The anodic oxidation using the forming electrolyte of the present invention may be performed over the whole surface of metal, or may be performed for only a part of it. When an oxide coating film is formed on a part of metal, a segment which should be subjected to the anodic oxidation is selected beforehand by using photoresist or the like.

After the anodic oxidation using the forming electrolyte of the present invention, the metal may be further heat-treated in order to further enhance the insulation property of the oxide coating film. For example, the insulation property can be enhanced by heating at about 200–400° C.

The insulation property may further be enhanced by forming an insulation film other than the oxide coating film formed by the anodic oxidation. For example, as for TFT devices, an SiN film or SiO$_2$ film can be formed. Although these films are formed at an elevated temperature of 200° C. or more, the generation of hillocks is prevented even under such an elevated temperature so long as the oxide coating film is formed by using the forming electrolyte of the present invention.

By using the forming electrolyte of the present invention, anodic oxidization can be performed for various metals. Examples of the metal to be treated include, for example, aluminum and aluminum alloys. In case of aluminum alloys, the kind and the number of the kinds of metals that are combined with aluminum are not particularly limited. Therefore, all of aluminum or aluminum alloys that can be used for wiring of TFT devices or integrated circuits can be effectively anodized by using the forming electrolyte of the present invention.

Because pure aluminum is relatively active and likely to generate hillocks, alloys containing a trace content of elements other than aluminum is preferably used as a wiring material. For example, alloys composed of aluminum admixed with a rare earth element such as Sc, Y, La, Pr, Nd, Gd, Dy, Ho and Er (JP-A-8-250494) are used. The forming electrolyte of the present invention can be suitably used for aluminum alloys containing such rare earth elements, preferably aluminum alloys containing Sc, Nd or Gd, particularly preferably aluminum alloys containing Nd. Although the content of the rare earth elements in an aluminum alloy is not particularly limited, it is generally 10 atomic % or less, preferably 6 atomic % or less, particularly preferably within a range of 0.05–3 atomic %.

In addition to the above-mentioned alloys, the forming electrolyte of the present invention can be used for alloys admixed with Si, Cu and Pd, alloys admixed with a valve metal such as Ti, Ta, Zr, Hf, Nb, W and Mo (JP-A-8-286209), and the like. In general, when these elements are added to aluminum, electric resistance increases markedly. For this reason, the addition amount of these elements is generally limited to around 0.01–3% so that electric resistance should be 10 $\mu\Omega$·cm or less, preferably 5 $\mu\Omega$·cm or less. Moreover, the forming electrolyte of the present invention can be used for alloys undergone heating, after mixing of an additional metal and aluminum, at 300–450° C. so that it should be deposited as an intermetallic compound of the additional metal and aluminum.

The method for forming oxide coating films using the forming electrolyte of the present invention can be widely utilized in various technical fields. For example, it can be utilized for structural materials of, for example, aircraft, vessels, automobiles, buildings, architectural structures and the like as well as home articles, optical instruments and the like in order to impart corrosion resistance and weather resistance. Further, it can also be utilized for anodized aluminum electric wires, printed circuit board substrates, electrolytic capacitors, magnetic recording discs, switching devices, humidity sensors and the like in order to impart electric, electronic, and magnetic characteristics. Moreover, it can also be utilized for solar heat absorption panels, reflector panels, multi-color alumite, photosensitive alumite, luminescent devices, fluorescent devices, IC cooling wheels and the like for the purpose of imparting optical and thermal characteristics. In addition, it can also be utilized for lubricous alumite, hard anodic oxidation coatings, speaker vibrating plate and the like for the purpose of giving specific mechanical properties. Furthermore, it can also be utilized for PS printing plates, nameplates, ornamental panels, transfer drums and the like for the purpose of giving characteristics concerning printing, ornament, and design. In addition, it can also be utilized for catalysts, moisture conditioned alumite, adsorbents, ion-selective permeable membranes, membrane filters and the like.

The method for forming oxide coating films using the forming electrolyte of the present invention is particularly useful when high insulation property is required for oxide coating films like in wiring of TFT devices or integrated circuits. It is especially effective if it is utilized for insulation film forming of gate wiring of TFT devices used for liquid crystal display devices. TFT devices currently put into practical use are classified, depending on the lamination order of gate wiring, into two types, the bottom gate type shown in FIG. 1, and the top gate type shown in FIG. 2. Although the present invention can be utilized for either type of TFT devices, it is applied more effectively for the bottom gate type for performing anodic oxidation.

In order to manufacture the bottom gate type TFT device shown in FIG. 1, a gate wiring (gate electrode) 2 is first deposited by the sputtering method and patterned on the substrate 1, which is usually made of alkali free glass. In this device, the deposited gate wiring is the metal to be subjected to the anodic oxidation in the subsequent step. Therefore, according to the present invention, pure aluminum or an aluminum alloy which contains a trace content of the above-mentioned rare earth metal, valve metals, Si, Cu, Pd etc. is usually deposited as the gate wiring. Then, the device is subjected to anodic oxidation using the forming electrolyte of the present invention to form the oxide coating film 3 excellent in insulation property on the surface of the gate electrode 2, and subjected to heat treatment to stabilize the coating film as required. When it is necessary to further enhance the insulation between the gate electrode and a semiconductor layer, an SiN film is deposited by CVD to form a gate insulation film 4. At this time, generation and growth of hillocks are suppressed even under an elevated temperature during the heat treatment of the oxide coating film 3 and CVD. On the gate insulation film 4, a semiconductor layer 5 is further formed. While an amorphous or polycrystal silicone film heat-treated at a temperature above 450° C. has conventionally been used for the semiconductor layer, a polycrystal silicone film heat-treated at a lower temperature of 350° C. or less is also developed recently.

Finally, the TFT device can be completed by forming a source electrode 6 and a drain electrode 7 on the semiconductor layer 5.

Next, the method for manufacturing a metal wiring of the invention will be explained.

The method for manufacturing a metal wiring of the invention is characterized as including a step of forming an oxide coating film by anodic oxidation in a nonaqueous solution containing a salt of inorganic oxoacid or a salt of organic carboxylic acid on an aluminum wiring containing in a range of 0.01% by weight to 8% by weight of a rare earth element, an aluminum wiring containing a rare earth element and having a specific resistance of 10 $\mu\Omega\cdot$cm or lower, an aluminum wiring containing a rare earth element and having 0.01 to 10000 of a peak intensity ratio of Al (220) peak to Al (111) peak, Al (220)/Al (111), or integration intensity ratio of Al (220) peak to Al (111) peak, Al (220)/Al (111), respectively by X-ray diffraction using CuK $\alpha$ rays.

In this specification, a "Peak intensity ratio of X-ray diffraction" refers to an intensity ratio of the both Al (111) peak and Al (220) peak given by deducting background from the peaks in the chart measured with CuK $\alpha$ rays as a source. The peak intensity ratio Al (220)/Al (111) is preferably from 0.01 to 10000, more preferably from 0.03 to 100, and especially preferably from 0.05 to 1. An "Integration intensity ratio" refers to a ratio of the Al (220) peak to Al (111) peak given by deducting background from the peaks in the chart measured with CuK $\alpha$ rays as a source. The integration intensity ratio Al (220)/Al (111) is preferably from 0.01 to 10000 more preferably from 0.03 to 100, and especially-preferably from 0.05 to 1.

The aluminum wiring used in the manufacturing method of the invention is not especially limited as for the others such as the material compositions or physical property so long as it is an aluminum wiring containing a rare earth element in a range of 0.01% by weight to 8% by weight, containing a rare earth element having a specific resistance of 10 $\mu\Omega\cdot$cm or lower, containing a rare earth element as well as having 0.01 to 10000 of a peak intensity ratio of Al (220) peak to Al (111) peak, Al (220)/ Al (111), by X-ray diffraction, or containing a rare earth element as well as having 0.01 to 10000 of an integration intensity ratio of Al (220) peak to Al (111) peak, Al (220)/Al (111), by X-ray diffraction.

As a rare earth element to be contained, Sc, Y, La, Pr, Nd, Sm, Gd, Tb, Dy, Ho, Er or the like can be exemplified, but the most preferable is Nd. One kind selected from these rare earth elements may be contained, or two or more kinds from those may be contained in combination. When two or more kinds of the rare earth elements are contained in combination, it is preferable to make the total amount so as to be in a range from 0.01% by weight to 8% by weight. The content of the rare earth elements is preferably at least 0.01% by weight or higher in order to prevent the hillock generation at the heating step, even if the specific resistance is 10 $\mu\Omega\cdot$cm or lower, or even if the peak intensity ratio, or the integration intensity ratio of Al(220)/Al(111) is in a range from 0.01 to 10000.

The aluminum wiring used in the manufacturing method of the invention may be an alloy of three elements or more by further adding Si or Cu, or a valve metal such as Ti, Ta, Zr, Hf, Nb or the like in addition to aluminum and rare earth elements. In general, when these elements are added to aluminum, specific resistance increases markedly. The specific resistance is usually 10 $\mu\Omega\cdot$cm or lower, and preferably 5 $\mu\Omega\cdot$cm or lower. For this reason, the addition amount in using these elements is preferably limited to the total of 0.01% by weight to 8% by weight, more preferably the total of 0.01% by weight to 5% by weight, and especially preferably the total of 0.01% by weight to 4% by weight.

In the invention, the method for forming a rare earth element containing aluminum wiring is not particularly limited. For example, by using an aluminum alloy target composed of aluminum added with rare earth elements, an aluminum alloy thin film of 100–1000 nm can be deposited on a substrate by the sputtering method. At this time, in order to lower the specific resistance, a part or whole of the rare earth elements in a state of solid solution in the aluminum alloy thin film may be deposited as an intermetallic compound by heat treatment. After this, the aluminum alloy thin film is patterned by a method such as etching or the like, so an aluminum wiring can be formed.

In the present invention, the forming electrolyte used for the anodic oxidation of aluminum wiring can be a nonaqueous solution containing one or more kinds of solutes selected from the group consisting of salt of inorganic oxoacid and salt of organic carboxylic acid.

The inorganic oxoacid available in the present invention refers to an inorganic acid having a hydrogen atom, capable of dissociating as a proton, bound to the oxygen atom, and the central atom of which may be of either nonmetallic or metallic. Specific examples thereof include boric acid, phosphoric acid, sulfuric acid, nitric acid, silicic acid, carbonic acid, tungstic acid, molybdic acid, chromic acid, vanadic acid, perrhenic acid, and permanganic acid. The inorganic oxoacid used for the present invention may be a polyacid, and the polyacid may be an isopolyacid or heteropolyacid.

The carboxylic acid available for the present invention can be selected from a wide variety of organic compounds having carboxyl group. There is no special limitation on the number nor binding site of the carboxyl group. Preferable are aromatic carboxylic acids and aliphatic carboxylic acids.

Available aromatic carboxylic acids include those having a benzene ring, condensed benzene ring, non-benzene aromatic ring or heterocyclic aromatic ring together with carboxyl group. The aromatic carboxylic acids having no hetero atom available in the present invention include salicylic acid, phthalic acid, benzoic acid, γ-resorcylic acid, toluic acid, cumilic acid, t-butylbenzoic acid, anisinic acid, 2,4-cresotinic acid, cinnamic acid, N-methylanthranilic acid, gentisic acid, gallic acid, and p-hydroxybenzoic acid. As the heteroaromatic carboxylic acid, nicotinic acid, 2-froinic acid, 2-tenoinic acid, and hydrazylbenzoic acid can be exemplified. Furthermore, so long as the desired advantages of the present invention are not degraded, aromatic carboxylic acids which have functional groups other than carboxyl group in addition thereto can also be used. For example, available are aromatic carboxylic acids that have a nitro group or an amino group such as nitrobenzoic acid, anthranilic acid, monomethylaminobenzoic acid and dimethylaminobenzoic acid.

The aliphatic polycarboxylic acid can be typified by aliphatic dicarboxylic acid, such as tartaric acid, citric acid, tartronic acid, malic acid, oxalic acid, malonic acid, succinic acid, glutaric acid, adipic acid, pimelic acid, suberic acid, azelaic acid, sebacic acid, dimethylmalonic acid, diethylmalonic acid, dipropylmalonic acid, 2-methylglutaric acid, 3,3-dimethylglutaric acid, 3-methyladipic acid, maleic acid, fumaric acid, itaconic acid, citraconic acid, 2-methyleneglutaric acid, 2-methyl-2-pentadicarboxylic acid and the like.

Cations for forming salts of such acids are not particularly limited. For example, ammonium ion; alkali metal ion;

primary, secondary, tertiary or quaternary alkylammonium ion; phosphonium ion; sulfonium ion and the like can be used. Among these, it is particularly preferable to use ammonium ion; or primary, secondary, tertiary or quaternary alkylammonium ion. In the case of using an alkylammonium ion, the size of the alkyl group can be selected considering the solubility in the solvent. Usually, an alkyl group with a carbon number of 1 to 4 is selected.

These solutes may be used individually, or in any combination of one or more of them. Moreover, the solutes listed above may be used in combination with other solutes. Preferable solutes as contained in the forming electrolyte of the present invention include salt of aliphatic dicarboxylic acid having a carbon number of 3 to 5, and salt of organic carboxylic acid; more preferably ammonium salt of aromatic carboxylic acid, and still more preferably ammonium salicylate.

The main solvent used for the forming electrolyte of the present invention is a nonaqueous solvent, and more specifically, a solvent containing one or more solvents selected from the group consisting of those having an alcoholic hydroxyl group and aprotic organic solvents.

While the solvents having an alcoholic hydroxyl group are available irrespective of species, preferable is aliphatic alcohol. For examples, available are monohydric alcohols such as methanol, ethanol, propanol, and isopropanol; dihydric alcohols such as ethylene glycol and propylene glycol; and polyhydric alcohols, i.e., trihydric or above. Further, so long as the desired advantages of the present invention are not degraded, solvents having a functional group other than alcoholic hydroxyl group in their molecules can also be used. For example, solvents having an alkoxy group in addition to the alcoholic hydroxyl group, for example, methylcellosolve or cellosolve can also be used.

The aprotic organic solvent may be either a polar solvent, or nonpolar solvent. Examples of the polar solvent include, for example, lactone solvents such as γ-butyrolactone, γ-valerolactone and δ-valerolactone; carbonate solvents such as ethylene carbonate, propylene carbonate and butylene carbonate; amide solvents such as N-methylformamide, N-ethylformamide, N,N-dimethylformamide, N,N-diethylformamide, N-methylacetamide, N,N-dimethylacetamide and N-methylpyrrolidinone; nitrile solvents such as 3-methoxypropionitrile and glutaronitrile; phosphate solvents such as a trimethyl phosphate and triethyl phosphate. Examples of the nonpolar solvent include, for example, hexane, toluene, silicone oil and the like.

These solvents may be used individually, or in any combination of two or more of them. Particularly preferable solvents for the forming electrolyte of the present invention are ethylene glycol, propylene glycol, and a mixed solvent thereof. The solvent may be added with water in an amount of less than 50% by weight, and more preferably less than 30% by weight. Water content for the case that the solvent contains water is preferable 0.1% or more and less than 25% by weight, and more preferably 0.1% or more and less than 20% by weight. The solute concentration of the forming electrolyte of the present invention is generally selected so as to be within a range of 0.001–30% by weight, and preferably 0.05–15% by weight.

In this invention, the conditions for carrying out the anodic oxidation are not particularly limited in the same as mentioned above. However, the temperature for the anodic oxidation is limited to be within a temperature range where the forming electrolyte may stably exist as a liquid, and generally in the range of −20 to 150° C., preferably 10 to 100° C. The methods for controlling electric current and voltage for the anodic oxidation are not particularly limited, and a suitable combination of such conditions that an oxide coating film should be formed on a surface of aluminum containing metal can be optionally used. Usually, formation is carried out at a constant current to a predetermined formation voltage (Vf), and after the formation voltage is achieved, the anodic oxidation is carried out by maintaining the voltage for a certain period of time. The current density for the anodic oxidation may be in a range of 0.001–100 mA/cm$^2$, preferably in a range of 0.01–10 mA/cm$^2$. The Vf is usually selected to be within a range of 2–200 V, preferably in a range of 5–150 V. Further, an alternative current with a constant peak current value may also be used instead of the direct current power source until the formation voltage is obtained, and then the current may be changed to a direct current voltage to continue the formation by maintaining that voltage for a certain period of time.

The step of anodic oxidation of the present invention may be performed over the whole surface of the aluminum containing metal, or may be performed for only a part of it. When an oxide coating film is formed on a part of the aluminum containing metal, a segment which should be subjected to the anodic oxidation is selected beforehand by using photoresist or the like. The aluminum containing metal wiring formed by the method of the invention prevents the hillock generation even if it is further heat-treated, so an SiN film or SiO$_2$ film can be formed on the aluminum containing metal wiring by a step carried out at a relatively elevated temperature such as CVD or the like.

The metal wiring manufactured by the method of the invention has an excellent advantage capable of fully suppressing the hillock generation while maintaining a low specific resistance. Such an excellent advantage is produced by conducting the step of the invention where anodic oxidation of an aluminum wiring having a relatively low content of rare earth elements is carried out in a nonaqueous solution containing a salt of the inorganic oxoacid or a salt of organic carboxylic acid.

It was considered in the prior arts that the hillock generation could not be fully suppressed unless a relatively large amount of rare earth elements were to be contained in the aluminum wiring, so the present invention where a lower content of the rare earth elements is more effective for hillock inhibition is a marvelous knowledge. In the present invention, such an unexpected advantage is obtained by optimizing the combination of the metal wiring composition and the forming electrolyte. Although it is not intended to be bound by any specific theory, it is considered that the excellent hillock inhibition advantage of the present invention can be obtained by using a nonaqueous solution as a forming electrolyte during anodic oxidation because it has a different distribution of rare earth elements moving into the oxide coating from that of rare earth elements in using a normal aqueous solution as a forming electrolyte. Therefore, the aluminum wiring manufactured by the method of the present invention, different from the conventional aluminum wiring containing a relatively large amount of rare earth elements, can hardly suffer from negative influences caused by the rare earth elements movement into the oxide coating film during anodic oxidation.

The method for manufacturing a metal wiring of the invention can be widely utilized in various technical fields since it has such excellent advantages. It is particularly effective for manufacturing wiring of, such as, TFT devices or integrated circuits which have fine patterns and include a step carried out subsequently at a relatively elevated temperature such as CVD. It is especially effective if it is utilized for forming of gate wiring of TFT devices used for liquid crystal display devices. The method of the present invention can be applied for the both of the bottom gate type and top gate type of TFT devices.

In order to manufacture the bottom gate type TFT device shown in FIG. 1, a rare earth element containing aluminum gate covered with the oxide coating film by the method of the present invention is first formed on a substrate, which is usually made of alkali free glass. Heat treatment is carried out to enhance an insulation property of the oxide coating film as required. When it is necessary to further enhance the insulation property between the gate electrode and a semiconductor layer, an SiN film is deposited by CVD to form a gate insulation film 4. At this time, generation and growth of hillocks are suppressed even under an elevated temperature during the heat treatment of the oxide coating film 3 and CVD, because the gate wiring is formed by the method of the present invention. On the gate insulation film 4, a semiconductor layer 5 is further formed. While an amorphous or polycrystal silicone film heat-treated at a temperature above 450° C. has conventionally been used for the semiconductor layer, a polycystal silicone film heat-treated at a lower temperature of 350° C. or less is also developed recently, and the heat treatment temperature is expected to be lowered at about 300° C. in future. Finally, the TFT device can be manufactured by forming a source electrode 6 and a drain electrode 7 on the semiconductor layer 5.

Also, an electrode is placed on the oxide coating film formed by the manufacturing method of the present invention so as to make a two-terminal nonlinear device. In this case, the method of the present invention can manufacture a device which does not suffer from lower reliability caused by heat treatment. Other than those mentioned above, the manufacturing method of the present invention can be widely applied to the applications which require low specific resistance and hillock inhibition such as the metal wiring of the top gate type TFT device shown in FIG. 2 or the metal wiring of the integrated circuits, or the like.

EXAMPLES

The present invention will be explained more specifically hereinafter by referring to the following examples.

The components, ratios, operating procedures and the like mentioned in the following examples may be suitably modified without leaving from the concept of the present invention. Therefore, the scope of the present invention is not limited by the specific examples shown in the following examples.

Example 1

An alloy thin film of specific composition having a thickness of about 400 nm was deposited on a glass substrate by the sputtering method. This thin film was subjected to constant current formation to 100 V at a predetermined current density in a predetermined forming electrolyte, and then constant voltage formation for about 2 hours to form an oxide coating film. The time required for the constant current formation was recorded. Further, it was heat-treated under nitrogen atmosphere at a predetermined temperature to stabilize the coating film. Then, an electrode thin film was formed by depositing about 400 nm of aluminum by the sputtering method to produce an MIM type device having a pattern of 1 mm$\phi$.

By using the alloy thin film of this MIM type device as the ground, and the aluminum thin film as the working electrode, voltage elevating stepwise by 1 V from 0 V was applied to measure leakage current. The voltage at which an electric current of 100 mA or higher flowed between the both electrodes was recorded as a withstanding voltage.

Compositions of the alloy thin films, compositions of forming electrolytes, current densities, heat treatment temperatures, discharge electric currents, measured withstanding voltages and constant current formation time used in the above-mentioned process are collectively shown in Table 1. When each formed oxide coating film was observed by a microscope, substantially no hillocks were observed.

TABLE 1

| | | Forming electrolyte | | | | | Withstand voltage | | |
|---|---|---|---|---|---|---|---|---|---|
| | Alloy | | | Solute | Current | Heat treatment | | | |
| No. | thin Film | Solute | Solvent | concentration | density (mA/cm²) | temperature (° C.) | Discharge current | Withstand voltage (V) | Formation time (second) |
| 1 (Invention) | A | Bistriethylammonium sulfate | Ethylene glycol | 10 wt% | 0.1 | 350 | 100 mA | 76, −75 | — |
| 2 (Invention) | A | Triethylammonium dihydrogenborate | Ethylene glycol | 10 wt % | 0.1 | 350 | 100 mA | 52, −53 | 2520 |
| 3 (Invention) | A | Triethylammonium dihydrogenphosphate | Ethylene glycol | 10 wt % | 0.1 | 350 | 100 mA | 56, −54 | 2169 |
| 4 (Invention) | A | Tetraethylammonium vanadate | Ethylene glycol | 10 wt % | 0.1 | 350 | 100 mA | 52, −57 | 2595 |
| 5 (Invention) | A | Ammonium salicylate | Ethylene glycol | 10 wt % | 0.1 | 350 | 100 mA | 74, −80 | — |
| 6 (Invention) | A | Ammonium phthalate | Ethylene glycol | 10 wt % | 0.1 | 350 | 100 mA | 52, −48 | — |
| 7 (Invention) | A | Ammonium benzoate | Ethylene glycol | 10 wt % | 0.1 | 350 | 100 mA | 48, −46 | — |
| 8 (Invention) | A | Ammonium γ-resorcylate | Ethylene glycol | 10 wt % | 0.1 | 350 | 100 mA | 52, −49 | — |
| 9 (Invention) | A | Ammonium malonate | Ethylene glycol | 10 wt % | 0.1 | 350 | 100 mA | 45, −44 | — |
| 10 | A | Ammonium pentaborate | Water | 10 wt % | 0.1 | 350 | 100 mA | 34, −44 | 2880 |
| 11 | A | Diammonium tartrate | Water | 10 wt % | 0.1 | 350 | 100 mA | 40, −40 | 4405 |
| 12 (Invention) | B | Triethylammonium dihydrogenborate | Ethylene glycol | 10 wt % | 1 | 300 | 100 mA | 98, −95 | 208 |

TABLE 1-continued

| No. | Alloy thin Film | Solute | Solvent | Solute concentration | Current density (mA/cm$^2$) | Heat treatment temperature (° C.) | Discharge current | Withstand voltage (V) | Formation time (second) |
|---|---|---|---|---|---|---|---|---|---|
| 13 (Invention) | B | Triethylammonium dihydrogenphosphate | Ethylene glycol | 10 wt % | 1 | 300 | 100 mA | 96, −99 | 179 |
| 14 (Invention) | B | Tetraethylammonium vanadate | Ethylene glycol | 10 wt % | 1 | 300 | 100 mA | 99, −91 | 166 |
| 15 (Invention) | B | Ammonium salicylate | Ethylene glycol | 10 wt % | 1 | 300 | 100 mA | 99, −95 | 228 |
| 16 (Invention) | B | Ammonium phthalate | Ethylene glycol | 10 wt % | 1 | 300 | 100 mA | 94, −98 | 199 |
| 17 (Invention) | B | Ammonium benzoate | Ethylene glycol | 10 wt % | 1 | 300 | 100 mA | 76, −65 | 207 |
| 18 (Invention) | B | Ammonium γ-resorcylate | Ethylene glycol | 10 wt % | 1 | 300 | 100 mA | 99, −95 | 211 |
| 19 (Invention) | B | Ammonium maleate | Ethylene glycol | 10 wt % | 1 | 300 | 100 mA | 87, −70 | 185 |
| 20 (Invention) | B | Ammonium malonate | Ethylene glycol | 10 wt % | 1 | 300 | 100 mA | 98, −98 | 225 |
| 21 | B | Diammonium tartrate | Water | 10 wt % | 1 | 300 | 100 mA | 41, −62 | 299 |
| 22 (Invention) | C | Triethylmethyl-ammonium salicylate | Ethylene glycol | 0.1 mol/l | 1 | 300 | 1 nA | 78, −88 | 244 |
| 23 (Invention) | C | Tristriethylmethyl-ammonium borate | Ethylene glycol | 0.1 mol/l | 1 | 300 | 1 nA | 72, −74 | 264 |
| 24 | C | Triethylmethyl-ammonium salicylate | Water | 0.1 mol/l | 1 | 300 | 1 nA | 42, −39 | 286 |
| 25 | C | Diammonium tartrate | Water | 0.1 mol/l | 1 | 300 | 1 nA | 36, −58 | 376 |
| 26 (Invention) | A | Triethylmethyl-ammonium salicylate | Propylene carbonate | 0.4 mol/l | 0.1 | 350 | 1 nA | 42, −46 | – |
| 27 (Invention) | A | Triethylmethyl-ammonium salicylate | γ-butyrolactone | 0.4 mol/l | 0.1 | 350 | 1 nA | 36, −41 | – |
| 28 (Invention) | A | Tristriethylmethyl-ammonium borate | Propylene carbonate | 0.1 mol/l | 0.1 | 350 | 1 nA | 39, −48 | – |
| 29 | A | Triethylmethyl-ammonium salicylate | Water | 0.4 mol/l | 0.1 | 350 | 1 nA | 6, −11 | – |
| 30 (Invention) | C | Triethylmethyl-ammonium salicylate | Propylene carbonate | 0.1 mol/l | 1 | 300 | 100 mA | 95, −87 | 264 |
| 31 (Invention) | C | Triethylmethyl-ammonium salicylate | γ-butyrolactone | 0.1 mol/l | 1 | 300 | 100 mA | 97, −98 | 265 |
| 32 (Invention) | C | Tristriethylmethyl-ammonium borate | Propylene carbonate | 0.1 mol/l | 1 | 300 | 100 mA | 96, −89 | 211 |
| 33 (Invention) | C | Tristriethylmethyl-ammonium borate | γ-butyrolactone | 0.1 mol/l | 1 | 300 | 100 mA | 94, −80 | 217 |
| 34 | C | Triethylmethyl-ammonium salicylate | Water | 0.1 mol/l | 1 | 300 | 100 mA | 86, −42 | 286 |
| 35 | C | Diammonium tartrate | Water | 0.1 mol/l | 1 | 300 | 100 mA | 69, −58 | 376 |

Note:
Alloy thin film A; Al 98.5 wt %, Si 1.0 wt %, Cu 0.5 wt %
Alloy thin film B; Al 90 wt %, Nd 10 wt %
Alloy thin film C; Al 90.35 wt %, Sc 0.15 wt %, Cu 0.50 wt %

As seen from Table 1, when the forming electrolytes of the present invention were used, the formed oxide coating films showed higher insulation property, and required shorter constant current formation time compared with the cases where conventional forming electrolytes composed of an aqueous solution were used. Further, the oxide coating films formed by using the forming electrolytes of the present invention could prevent growth of hillocks even in the subsequent elevated temperature treatment. Therefore, by using the forming electrolyte of the present invention, an oxide coating film having high insulation property and capable of effectively preventing hillocks can be manufactured with a high throughput.

Example 2

An alloy thin film (90% by weight of Al, 10% by weight of Nd) having a thickness of about 400 nm was deposited on a glass substrate by the sputtering method. This thin film was subjected to constant current formation to 100 V at a current density of 1 mA/cm$^2$ in respective forming electrolyte shown in Table 2, and then constant voltage formation for about 2 hours to form an oxide coating film. Further, it was heat-treated under nitrogen atmosphere at 300° C. to stabilize the coating film. Then, an electrode thin film was formed by depositing about 400 nm of aluminum by the sputtering method to produce an MIM type device having a pattern of 1 mmϕ.

By using the alloy thin film of this MIM type device as the ground, and the aluminum thin film as the working electrode, voltage elevating stepwise by 1 V from 0 V was applied to measure leakage current. The voltage at which an electric current of 100 mA or higher flowed between the both electrodes was recorded as a withstanding voltage. The result is shown in Table 2. When each of the formed oxide coating films was observed by a microscope, substantially no hillocks were observed.

TABLE 2

| No | Forming electrolyte Solute | Solvent | Withstand voltage (V) |
|---|---|---|---|
| 36 (Invention) | Ammonium lactate | Ethylene glycol:water = 89:10 | 101, −115 |
| 37 (Invention) | Ammonium malate | Ethylene glycol:water = 89:10 | 105, −127 |
| 38 (Invention) | Ammonium asparate | Ethylene glycol:water = 89:10 | 103, −120 |
| 39 (Invention) | Ammonium glutamate | Ethylene glycol:water = 89:10 | 108, −126 |
| 40 | Ammonium tartrate | Ethylene glycol:water = 89:10 | 87, −102 |
| 41 | Ammonium tartrate | Ethylene glycol:water = 1:1 | 78, −79 |
| 42 | Ammonium tartrate | Water | 72, −75 |

Note: Every solute concentration of the forming electrolytes is 1% by weight. Every solvent ratio of the forming electrolytes is % by weight.

As seen from Table 2, when the forming electrolytes of the present invention were used, the formed oxide coating films showed higher insulation property. Also, the oxide coating film formed by using the forming electrolytes of the invention could prevent growth of hillocks even in the subsequent elevated temperature treatment. Therefore, by using the forming electrolyte of the present invention, an oxide coating film having high insulation property and capable of effectively preventing hillocks can be manufactured.

Example 3

An aluminum thin film having Nd containing amount of 3% by weight and a thickness of about 400 nm was deposited on a glass substrate by the sputtering method. The X-ray diffraction was carried out with respect to this thin film with an X-ray diffraction apparatus (Apparatus name: JDX-3500 manufactured by JEOL Ltd.) using CuK α rays, and a peak intensity ratio of Al (220) peak to Al (111) peak, Al (220)/ Al (111), and an integration intensity ratio of Al (220) peak to Al (111) peak, Al (220)/ Al (111), were 0.54 and 0.53 respectively. The specific resistance (the specific resistance of pre-heat treatment) of the thin film was 7.3 $\mu\Omega\cdot cm$. Further, it was heat-treated under nitrogen atmosphere at 300° C., and the specific resistance after the heat treatment was measured, and it was 3.9 $\mu\Omega\cdot cm$.

A glass substrate, before heat treatment, having a formed thin film was subjected to constant current formation to 100 V at a current density of 1 mA/cm$^2$ in ethylene glycol solution of 10% by weight of ammonium salicylate containing 4% by weight of water, and then constant voltage formation for about 2 hours to form an oxide coating film. Further, it was heat-treated under nitrogen atmosphere at 300° C. to stabilize the coating film.

For evaluation, an electrode thin film was formed on the heat-treated oxide coating film by depositing about 400 nm of aluminum by the sputtering method to produce an MIM type device.

Figure 3:
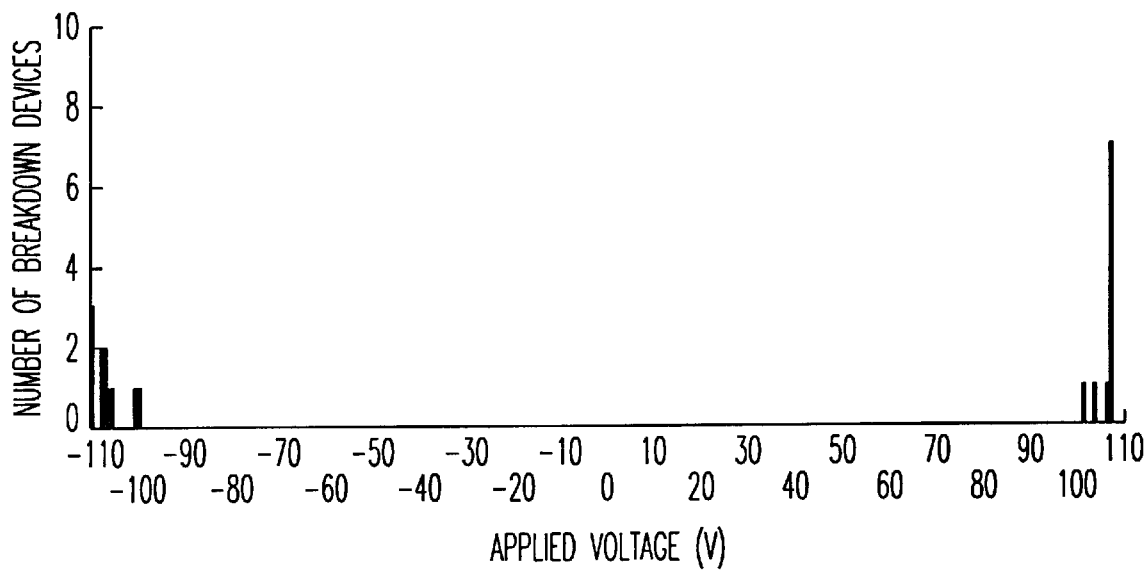
FIG. 3 is a result of a withstanding voltage measurement of MIM type device No. 43 (present invention).

By using the aluminum thin film containing Nd of 3% by weight as the ground, and the upper portion aluminum electrode as the working electrode, voltage elevating stepwise by 1 V from 0 V was applied to the formed MIM type device having a pattern of 1 mmφ, and the voltage at which an electric current of 0.1 A or higher flowed was recorded as a withstanding voltage. FIG. 3 shows the results of measuring the withstanding voltage in forwarding directions and reversing directions respectively 10 times. A thin film having lower fluctuation of the withstanding voltage is evaluated as being hard to cause the hillock growth because hillocks generated on the aluminum containing metal thin film covered with the oxide coating film tries to penetrate the oxide coating film, thereby lowering the withstanding voltage.

The weight ratios of Nd to Al, Nd:Al, of thin films, forming electrolytes and heat-treatment temperatures were modified as described in Table 3, and the same procedures were repeatedly carried out to produce MIM type devices. The results evaluated in the same way are collectively shown in Table 3.

TABLE 3

Figure 4:
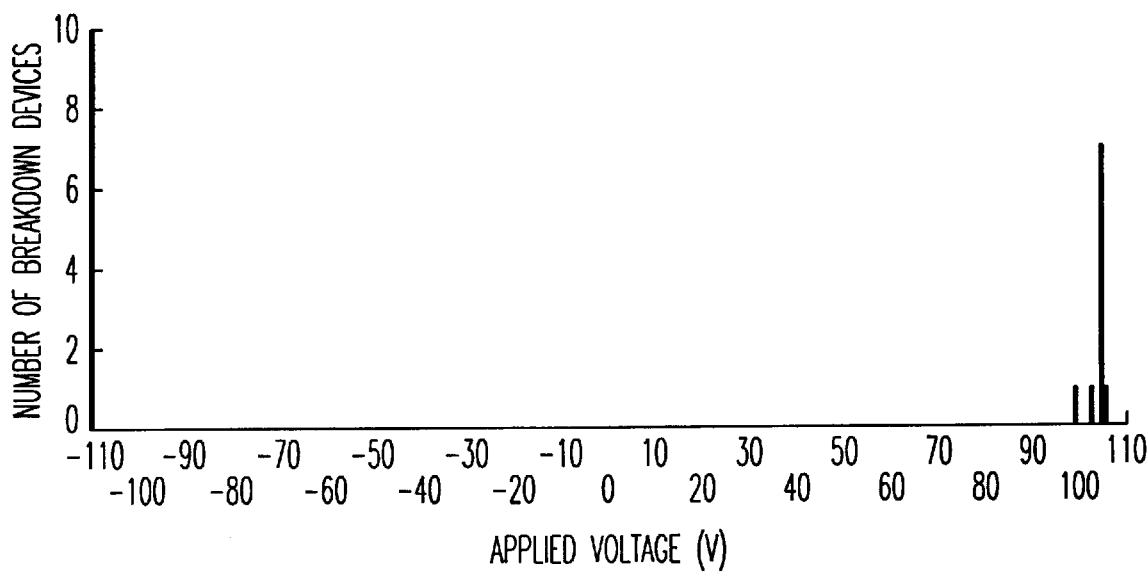
FIG. 4 is a result of a withstanding voltage measurement of MIM type device No. 44 (present invention).
Figure 5:
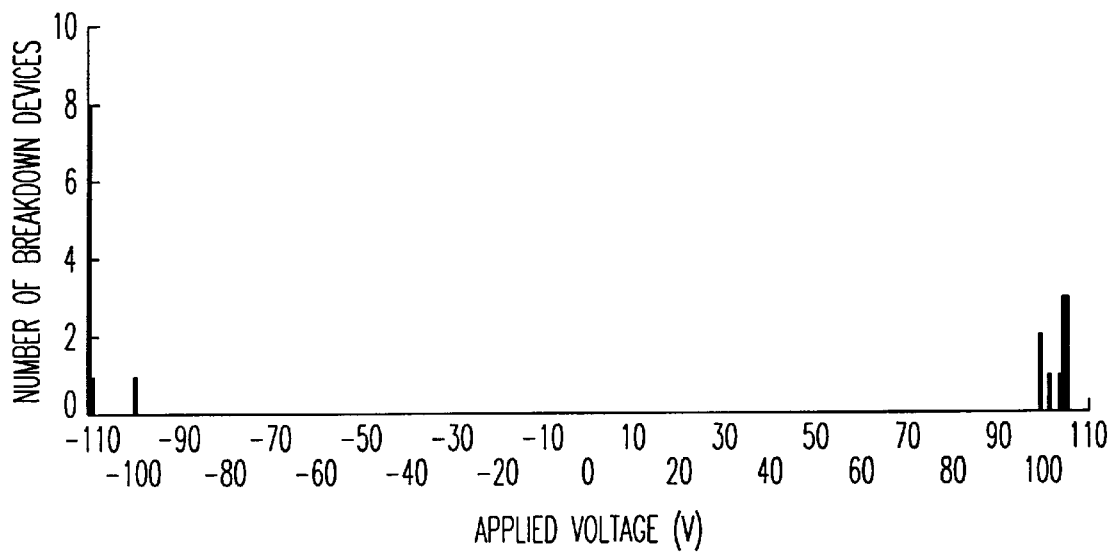
FIG. 5 is a result of a withstanding voltage measurement of MIM type device No. 45 (present invention).
Figure 6:
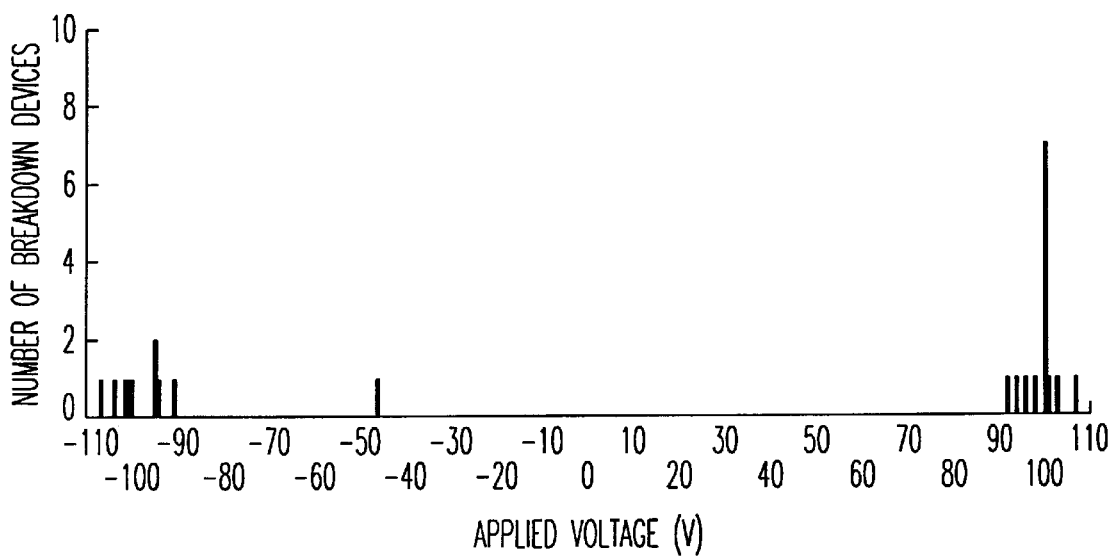
FIG. 6 is a result of a withstanding voltage measurement of MIM type device No. 46.
Figure 7:
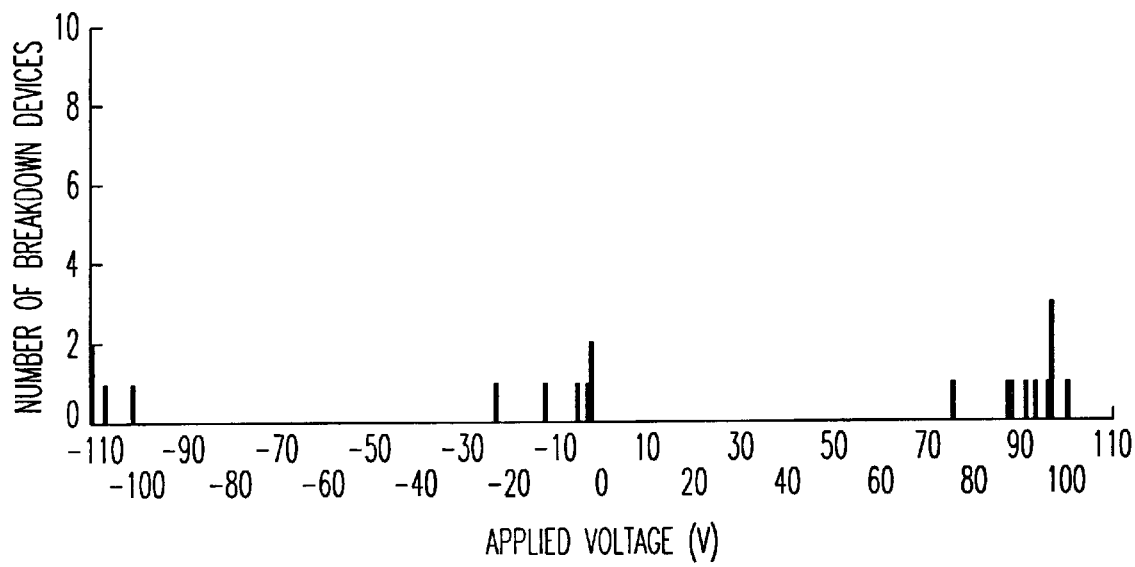
FIG. 7 is a result of a withstanding voltage measurement of MIM type device No. 47.
Figure 8:
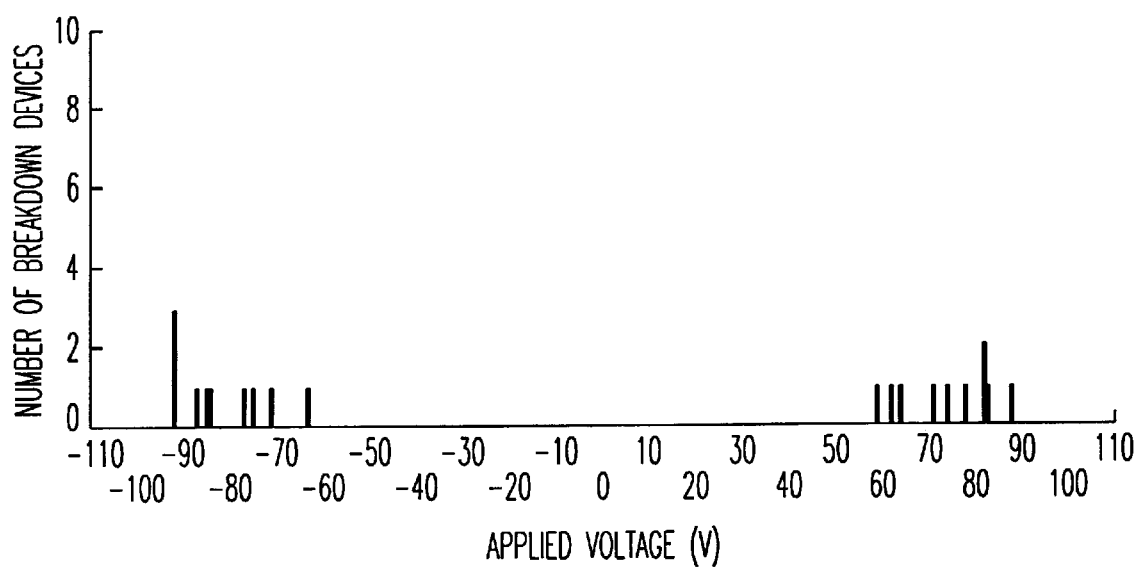
FIG. 8 is a result of a withstanding voltage measurement of MIM type device No. 48.
Figure 9:
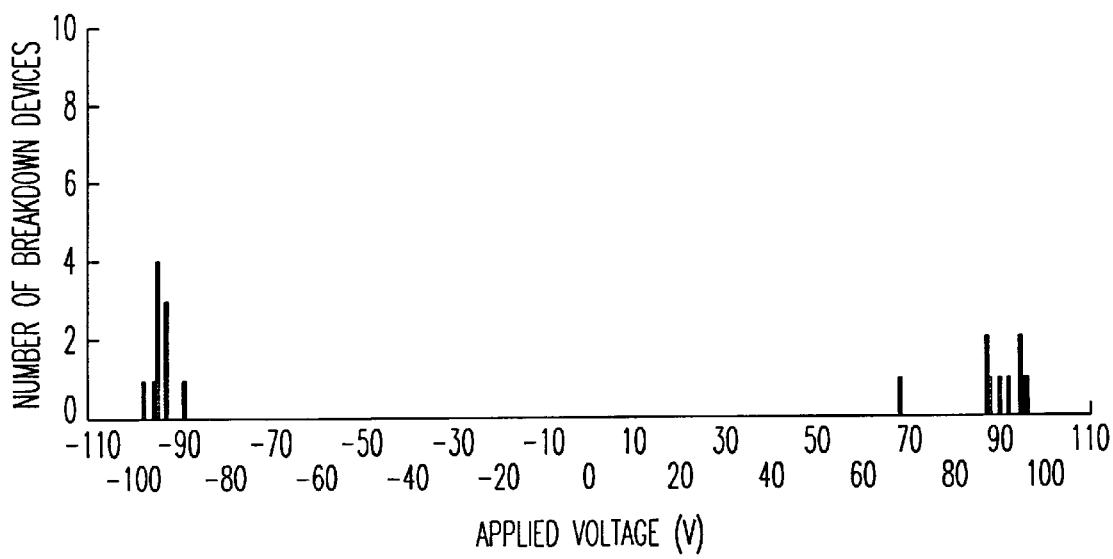
FIG. 9 is a result of a withstanding voltage measurement of MIM type device No. 49.
Figure 10:
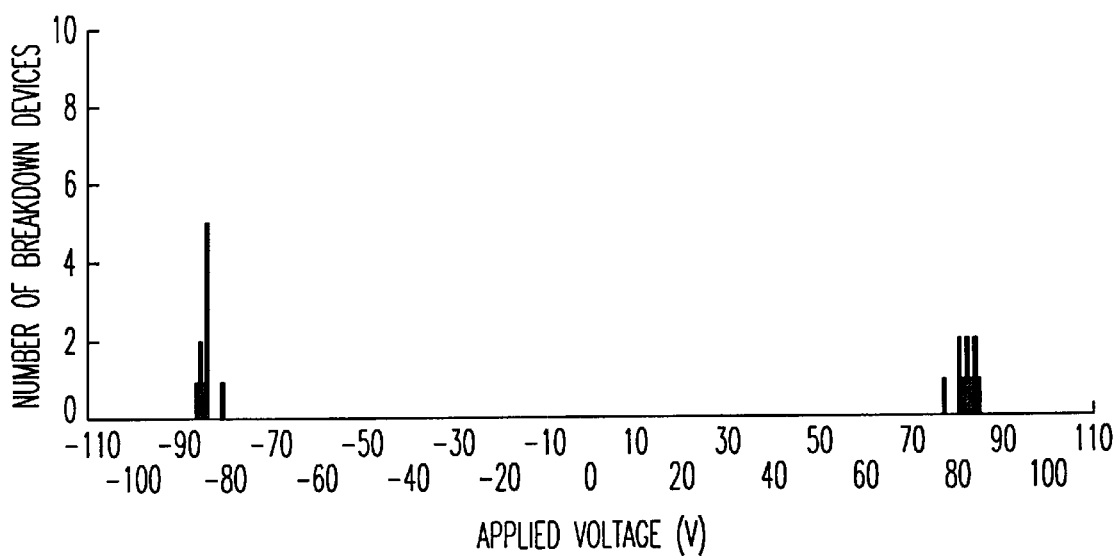
FIG. 10 is a result of a withstanding voltage measurement of MIM type device No. 50.
Figure 11:
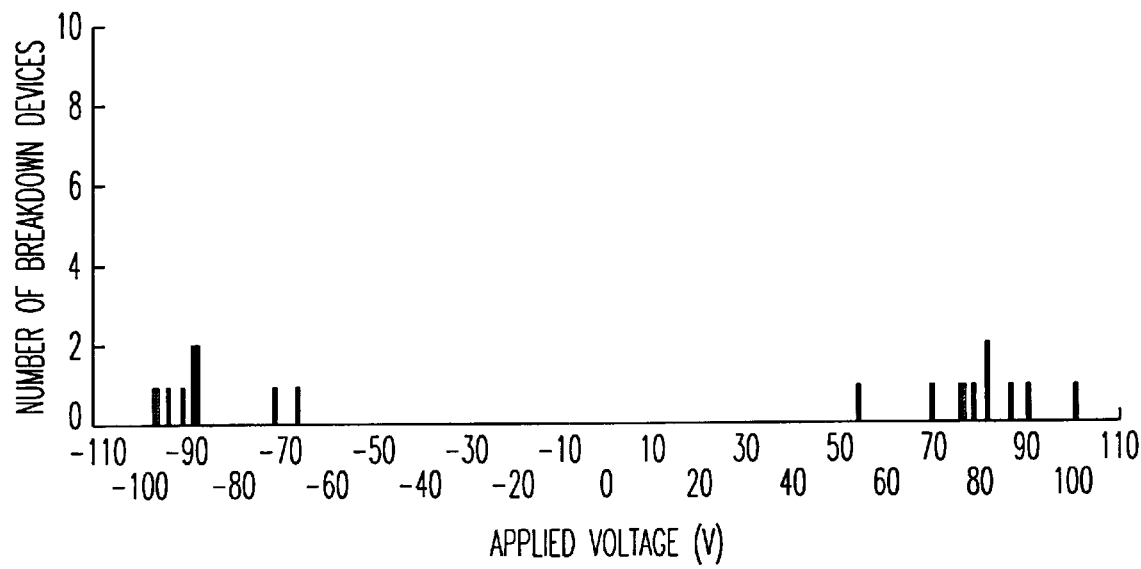
FIG. 11 is a result of a withstanding voltage measurement of MIM type device No. 51.
Figure 12:
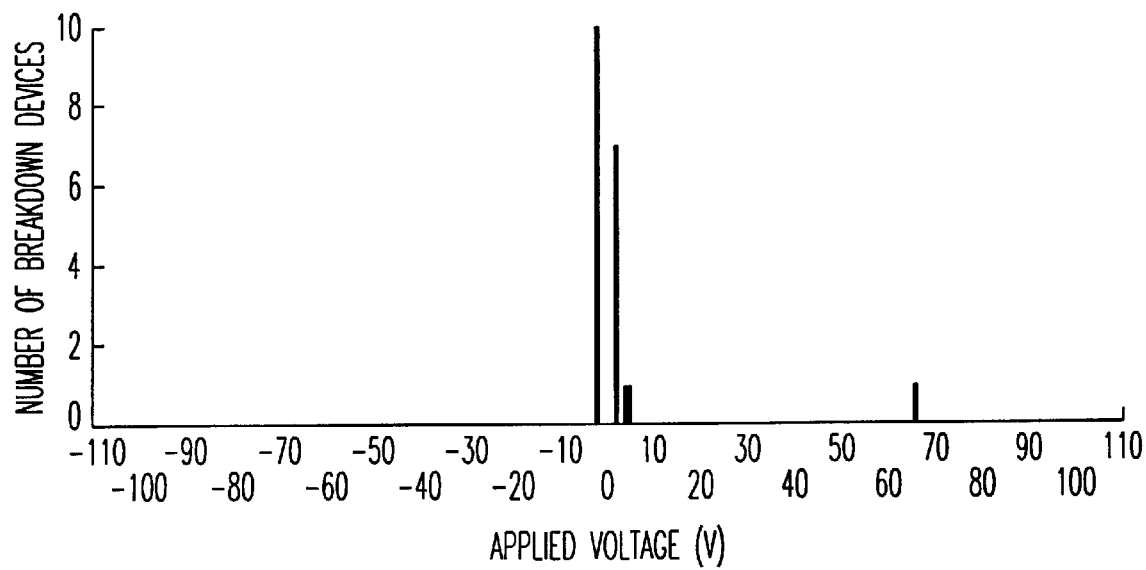
FIG. 12 is a result of a withstanding voltage measurement of MIM type device No. 52.
Figure 13:
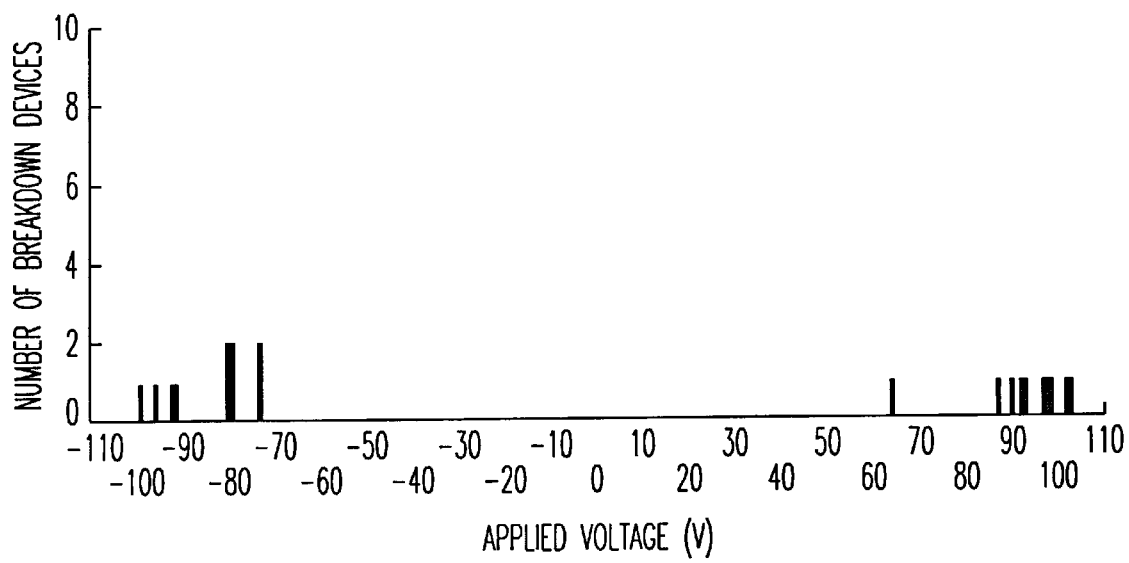
FIG. 13 is a result of a withstanding voltage measurement of MIM type device No. 54 (present invention).
Figure 14:
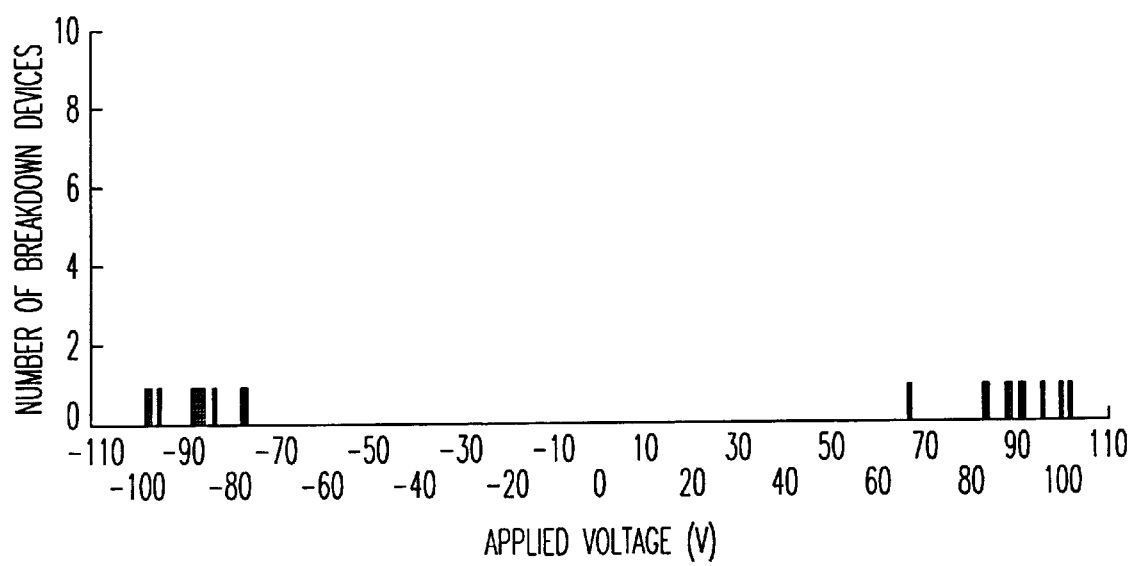
FIG. 14 is a result of a withstanding voltage measurement of MIM type device No. 55 (present invention).
Figure 15:
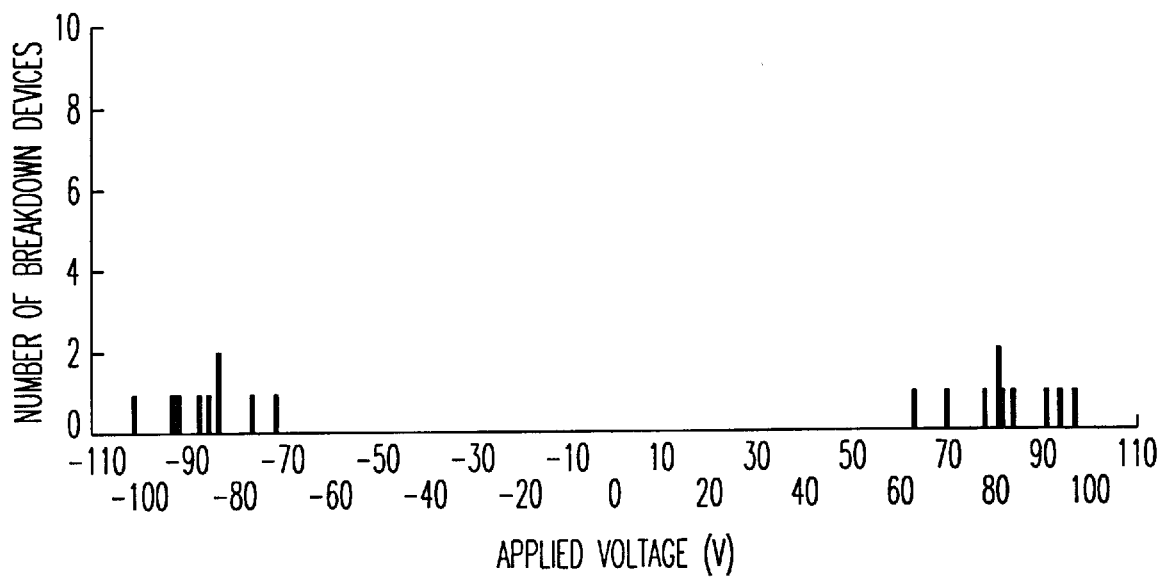
FIG. 15 is a result of a withstanding voltage measurement of MIM type device No. 56 (present invention).
Figure 16:
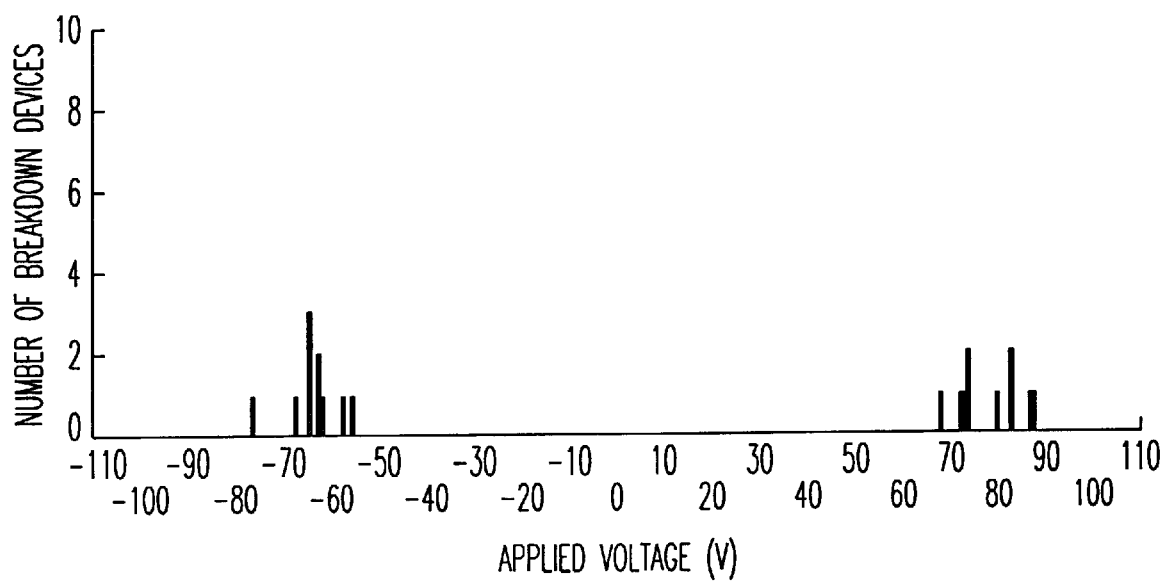
FIG. 16 is a result of a withstanding voltage measurement of MIM type device No. 57.

| No. | Nd:Al of Thin film (Weight ratio) | Forming electrolyte | Heat treatment temperature (° C.) | Al (220)/Al (111) Intensity ratio | Integration intensity ratio | Specific resistance ($\mu\Omega\cdot cm$) Before heat treatment | After heat treatment | withstand resistance |
|---|---|---|---|---|---|---|---|---|
| 43 (Invention) | 3:97 | A | 300 | 0.54 | 0.53 | 7.3 | 3.9 | FIG. 3 |
| 44 (Invention) | 2:98 | A | 300 | 0.28 | 0.32 | 6.6 | 3.8 | FIG. 4 |
| 45 (Invention) | 1:99 | A | 300 | 0.06 | 0.07 | 5.2 | 3.4 | FIG. 5 |
| 46 | 10:90 | A | 300 | 0.00 | 0.00 | 15.4 | 4.9 | FIG. 6 |
| 47 | 0:100 | A | 300 | 0.00 | 0.00 | 3.5 | 3.0 | FIG. 7 |
| 48 | 3:97 | B | 300 | 0.54 | 0.53 | 7.3 | 3.9 | FIG. 8 |
| 49 | 2:98 | B | 300 | 0.28 | 0.32 | 6.6 | 3.8 | FIG. 9 |
| 50 | 1:99 | B | 300 | 0.06 | 0.07 | 5.2 | 3.4 | FIG. 10 |
| 51 | 10:90 | B | 300 | 0.00 | 0.00 | 15.4 | 4.9 | FIG. 11 |
| 52 | 0:100 | B | 300 | 0.00 | 0.00 | 3.5 | 3.0 | FIG. 12 |
| 53 | 3:97 | C | 300 | 0.54 | 0.53 | 7.3 | 3.9 | (Note) |
| 54 (Invention) | 3:97 | A | 450 | 0.54 | 0.53 | 7.3 | 3.3 | FIG. 13 |
| 55 (Invention) | 2:98 | A | 450 | 0.28 | 0.32 | 6.6 | 3.2 | FIG. 14 |
| 56 (Invention) | 1:99 | A | 450 | 0.06 | 0.07 | 5.2 | 3.0 | FIG. 15 |
| 57 | 10:90 | A | 450 | 0.00 | 0.00 | 15.4 | 4.0 | FIG. 16 |

TABLE 3-continued

Figure 17:
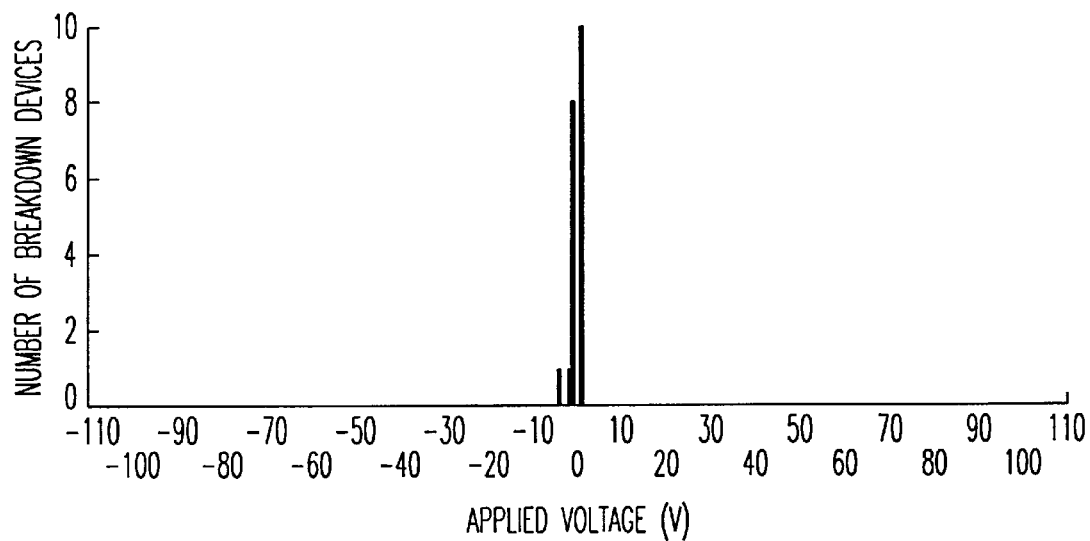
FIG. 17 is a result of a withstanding voltage measurement of MIM type device No. 58.
Figure 18:
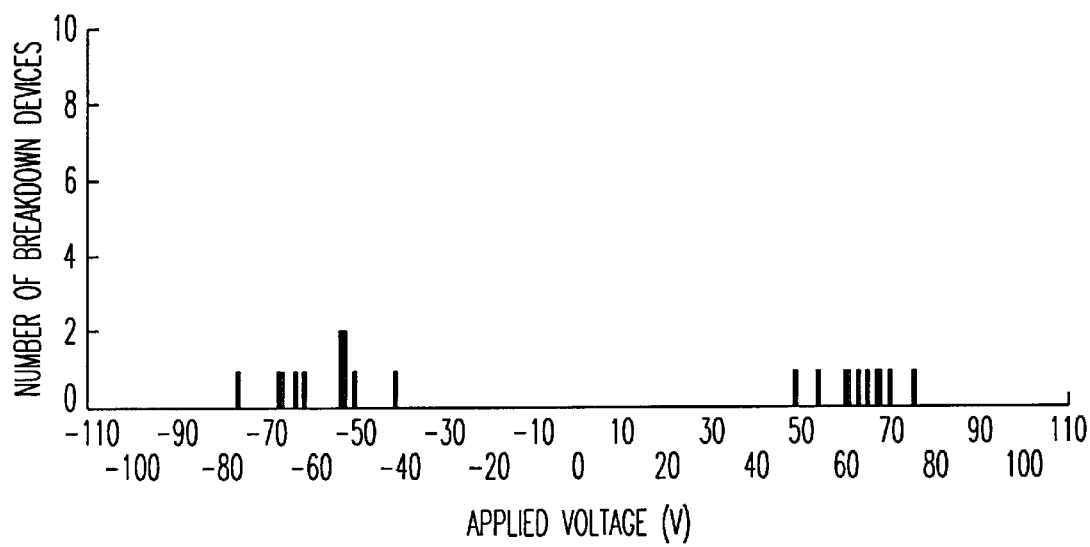
FIG. 18 is a result of a withstanding voltage measurement of MIM type device No. 59.

| No. | Nd:Al of Thin film (Weight ratio) | Forming electrolyte | Heat treatment temperature (° C.) | Al (220)/Al (111) Intensity ratio | Integration intensity ratio | Specific resistance ($\mu\Omega$·cm) Before heat treatment | After heat treatment | withstand resistance |
|---|---|---|---|---|---|---|---|---|
| 58 | 0:100 | A | 450 | 0.00 | 0.00 | 3.5 | 3.1 | FIG. 17 |
| 59 | 3:97  | B | 450 | 0.54 | 0.53 | 7.3 | 3.3 | FIG. 18 |

Forming electrolyte A: Ethylene glycol solution containing ammonium salicylate of 10% by weight (water content of 4% by weight).
Forming electrolyte B: Aqueous solution of ammonium tartrate of 10% by weight.
Forming electrolyte C: Aqueous solution of ammonium salicylate of 10% by weight.
(Note)
With respect to 53, MIN device for evaluation could not be formed since a part of the thin film was dissolved during forming step.

The devices manufactured according to the method of the invention where anodic oxidation of aluminum alloy having a rare earth element content of 0.01–8% by weight is carried in nonaqueous solution as forming electrolyte had a quite low fluctuation of the withstanding voltage and suppressed effectively the hillock generation (43–45, 54–56).

When aluminum alloys containing a large amount of rare earth elements (46, 57) and aluminum alloys containing no rare earth elements (47, 58) were subjected to anodic oxidation in the same forming electrolyte, on the other hand, fluctuation of the withstanding voltage was large and inhibition of the hillock generation was not sufficient when heat treatment was carried out at 300° C. or 400° C.

Regardless of the amount of the rare earth elements, the devices manufactured according to the conventional methods where anodic oxidation was carried out in aqueous solution as forming electrolyte had larger fluctuation of the withstanding voltage compared with that of the method of the invention, and inhibition of the hillock generation was insufficient (48–52). In addition, depending on the kind of the aqueous solutions used as forming electrolytes, an aluminum alloy having a rare earth element content of 0.01–8% by weight could not be anodized (53).

The devices (43–45, 54–56) manufactured according to the present invention where anodic oxidation of an aluminum wiring containing rare earth elements and having a specific resistance of 10 $\mu\Omega$·cm or lower was carried out in nonaqueous solution containing a salt of inorganic oxoacid or a salt of organic carboxylic acid had 4 $\mu\Omega$·cm or lower of a specific resistance after heat treatment at 300° C. or 450° C., so they can be favorably used for large or high-definition TFT-Lcds. On the other hand, the devices (46, 57) manufactured by using an aluminum wiring having a specific resistance exceeding 10 $\mu\Omega$·cm had a specific resistance of over 4 $\mu\Omega$·cm after heat treatment at 300° C. Although the specific resistance reached 4.0 $\mu\Omega$·cm by heat treatment at 450° C., inhibition of hillocks was not sufficiently carried, and therefore these devices are not sufficient for applications of large or high-definition TFT-Lcd. Although having a specific resistance of 10 $\mu\Omega$·cm or lower, elements manufactured by using an aluminum wiring containing no rare earth elements (47, 58) had a large fluctuation of the withstanding voltage, and therefore the inhibit of the hillock generation was not sufficiently carried out.

Furthermore, the elements (43–45, 54–56) manufactured according to the invention by using an aluminum wiring having a peak intensity ratio of Al (220) peak to Al (111) peak, Al (220)/Al (111), in a range from 0.01 to 10000, or an integration intensity ratio of Al (220) peak to Al (111) peak, Al (220)/Al (111), in a range from 0.01 to 10000 were suitable for anodic oxidation by nonaqueous forming electrolyte containing a salt of the inorganic oxoacid or a salt of the organic carboxylic acid. The elements had lower fluctuation of the withstanding voltage compared with that of the elements (46, 47, 57, 58) manufactured by using an aluminum wiring having an intensity ratio of 0, and therefore, hillocks were sufficiently suppressed.

INDUSTRIAL APPLICABILITY

The forming electrolyte of the present invention can be widely utilized for products and components for which anodic oxidation of metal, particularly aluminum or aluminum alloy, is required. In particular, by using it for insulation film formation of gate wiring of TFT devices, need of SiN insulation film can be eliminated, or it can be made thinner, and reliability of the devices can also be increased. Moreover, when it is utilized for wiring of integrated circuits, their reliability can also be increased because a higher dielectric voltage can be obtained.

In addition, the metal wiring manufactured according to the method of the invention has not only a property of suppressing the hillock generation but also a property of having a low specific resistance. Furthermore, the manufacturing cost can be reduced due to the less using amount of the expensive rare earth elements. Thus, the method of the present invention allows the aluminum containing metal wiring having a low specific resistance and high hillock inhibition effect to be formed with low cost, and therefore, it is especially useful for the procedures which requires reliability such as gate wiring of the TFT devices, wiring of the integrated circuits and the like.

The foregoing description of preferable embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A method for manufacturing a metal wiring, comprising:

forming an oxide coating film on an aluminum wiring by anodic oxidation in a nonaqueous solution containing a salt of an inorganic oxoacid or a salt of an organic carboxylic acid; and heat treating said aluminum wiring at a temperature of from 300–450° C.;

wherein said aluminum wiring contains a rare earth element in a range of 1% by weight to 8% by weight based on the weight of said aluminum wiring.

2. A method for manufacturing a metal wiring, comprising:

forming an oxide coating film on an aluminum wiring by anodic oxidation in a nonaqueous solution containing a salt of an inorganic oxoacid or a salt of an organic carboxylic acid; and heat treating said aluminum wiring at a temperature of from 300–450° C.;

wherein said aluminum wiring contains a rare earth element in a range of 1% by weight to 8% by weight based on the weight of said aluminum wiring; and wherein said aluminum wiring has a specific resistance of 10 $\mu\Omega\cdot$cm or lower.

3. A method for manufacturing a metal wiring, comprising:

forming an oxide coating film on an aluminum wiring by anodic oxidation in a nonaqueous solution containing a salt of an inorganic oxoacid or a salt of an organic carboxylic acid; and heat treating said aluminum wiring at a temperature of from 300–450° C.;

wherein said aluminum wiring contains a rare earth element in a range of 1% by weight to 8% by weight based on the weight of said aluminum wiring; and wherein said aluminum wiring has a peak intensity ratio of Al (220) peak to Al (111) peak by X-ray diffraction using CuK $\alpha$ rays, Al (220)/Al (111), of 0.01 to 10000.

4. A method for manufacturing a metal wiring, comprising:

forming an oxide coating film on an aluminum wiring by anodic oxidation in a nonaqueous solution containing a salt of an inorganic oxoacid or a salt of an organic carboxylic acid; and heat treating said aluminum wiring at a temperature of from 300–450° C.;

wherein said aluminum wiring contains a rare earth element in a range of 1% by weight to 8% by weight based on the weight of said aluminum wiring; and wherein said aluminum wiring has an integration intensity ratio of Al (220) peak to Al (111) peak by X-ray diffraction using CuK $\alpha$ rays, Al (220)/ Al (111) of 0.01 to 10000.

5. The method for manufacturing a metal wiring of any one of claims 1–4 wherein the nonaqueous solution has a main solvent containing an alcoholic hydroxyl group.

6. The method for manufacturing a metal wiring of claim 5, wherein the solvent having the alcoholic hydroxyl group is ethylene glycol or propylene glycol.

7. The method for manufacturing a metal wiring of any one of claims 1–4 wherein the organic carboxylic acid is salicylic acid.

8. The method for manufacturing a metal wiring of any one of claims 1–4, wherein the aluminum wiring is manufactured by a step containing a sputtering using an aluminum alloy target containing a rare earth element.

9. The method for manufacturing a metal wiring of any one of claims 1–4, wherein the rare earth element includes Nd.

10. A metal wiring manufactured by the manufacturing method disclosed in any one of claims 1–4.

11. The method according to claim 1, wherein said aluminum wiring containing said rare earth element has a specific resistance of 10 $\mu\Omega\cdot$cm or lower.

12. The method according to claim 11, wherein said aluminum wiring containing said rare earth element has a peak intensity ratio of Al (220) peak to Al (111) peak by X-ray diffraction using CuK $\alpha$ rays, Al (220)/Al (111), of 0.01 to 10000.

13. The method according to claim 1, wherein said aluminum wiring containing said rare earth element has an integration intensity ratio of Al (220) peak to Al (111) peak by X-ray diffraction using CuK $\alpha$ rays, Al (220)/Al (111) of 0.01 to 10000.

14. The method according to claim 1, wherein said heat treating occurs under a nitrogen atmosphere.

15. The method according to claim 2, wherein said heat treating occurs under a nitrogen atmosphere.

16. The method for manufacturing a metal wiring of claim 3, wherein the peak intensity ratio of Al (220) peak to Al (11) peak is within the range of 0.03 to 100.

17. The method for manufacturing a metal wiring of claim 3, wherein the peak intensity ratio of Al (220) peak to Al (111) peak is within the range of 0.05 to 1.

18. The method according to claim 3, wherein said heat treating occurs under a nitrogen atmosphere.

19. The method for manufacturing a metal wiring of claim 4, wherein the integration intensity ratio of Al (220) peak to Al (111) peak is within the range of 0.03 to 100.

20. The method for manufacturing a metal wiring of claim 4, wherein the integration intensity ratio of Al (220) peak to Al (111) peak is within the range of 0.05 to 1.

21. The method according to claim 4, wherein said heat treating occurs under a nitrogen atmosphere.

* * * * *

UNITED STATES PATENT AND TRADEMARK OFFICE
CERTIFICATE OF CORRECTION

PATENT NO.    : 6,368,485 B1
DATED         : April 9, 2002
INVENTOR(S)   : Makoto Ue et al.

It is certified that error appears in the above-identified patent and that said Letters Patent is hereby corrected as shown below:

<u>Title page,</u>
Item [30], Foreign Application Priority Data
"Nov. 27, 1997 (JP)............................ 9-3259814" should read
-- Nov. 27, 1997 (JP) ........................... 9-325814 --.

Signed and Sealed this

Twenty-fourth Day of September, 2002

Attest:

JAMES E. ROGAN
Attesting Officer       Director of the United States Patent and Trademark Office